(12) United States Patent
Uchihara et al.

(10) Patent No.: US 7,537,983 B2
(45) Date of Patent: May 26, 2009

(54) MOSFET

(75) Inventors: Takeshi Uchihara, Saitama-ken (JP);
Yasunori Usui, Kanagawa-ken (JP);
Akira Tanioka, Fukuoka-ken (JP);
Takuma Hara, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/344,178

(22) Filed: Feb. 1, 2006

(65) Prior Publication Data
US 2006/0170049 A1 Aug. 3, 2006

(30) Foreign Application Priority Data
Feb. 1, 2005 (JP) ............................. 2005-025607
Jan. 24, 2006 (JP) ............................. 2006-015154

(51) Int. Cl.
*H01L 21/84* (2006.01)
*H01L 21/8234* (2006.01)
(52) U.S. Cl. .................... 438/163; 438/479; 257/409; 257/347; 257/E21.619
(58) Field of Classification Search ............... 257/347, 257/348, 351, 333, 339, 342, 409, 488, 367, 257/E21.619; 438/149, 479, 517, 163
See application file for complete search history.

(56) References Cited

U.S. PATENT DOCUMENTS

| 5,412,241 | A | | 5/1995 | Merchant |
| 5,548,150 | A | * | 8/1996 | Omura et al. ............... 257/349 |
| 5,920,094 | A | * | 7/1999 | Nam .......................... 257/347 |
| 5,981,997 | A | * | 11/1999 | Kitamura .................... 257/335 |
| 6,028,337 | A | * | 2/2000 | Letavic et al. ............... 257/347 |
| 6,259,136 | B1 | * | 7/2001 | Kawaguchi et al. ......... 257/336 |
| 6,310,378 | B1 | | 10/2001 | Letavic et al. |
| 6,346,451 | B1 | | 2/2002 | Simpson et al. |

(Continued)

OTHER PUBLICATIONS

Degraeve, R. et al., "New Insights in the Relation Between Electron Trap Generation and the Statistical Properties of Oxide Breakdown", *IEEE Transactions on Electron Devices*, v. 45, No. 4, Apr. 1998, pp. 904-911.

(Continued)

*Primary Examiner*—Douglas M Menz
*Assistant Examiner*—Steven J Fulk
(74) *Attorney, Agent, or Firm*—Banner & Witcoff, Ltd

(57) ABSTRACT

In various aspects, a MOSFET may include an active region of a first conductivity type provided on an insulating layer, the active region having a first portion and a second portion, the first portion being thicker than the second portion; a base region of the first conductivity type provided on the insulating layer, the base region having a higher impurity concentration than the first portion of the active region, the base region being in contact with the first portion of the active region and the insulating layer; a drain region of a second conductivity type provided on the insulating layer, the drain region being in contact with the second portion of the active region and the insulating layer, the drain region being spaced from the base region; a source region of the second conductivity type provided on a surface of the base region; a gate insulating layer provided on the source region, the base region, the active region and the drain region; and a gate electrode provided on the gate insulating layer.

20 Claims, 28 Drawing Sheets

U.S. PATENT DOCUMENTS

| | | | |
|---|---|---|---|
| 6,468,878 | B1 | 10/2002 | Petruzzello et al. |
| 6,897,103 | B2 * | 5/2005 | Beasom ...................... 438/214 |
| 6,989,568 | B2 * | 1/2006 | Watanabe et al. ........... 257/343 |
| 2003/0183858 | A1 * | 10/2003 | Kitagawa et al. ............ 257/288 |
| 2004/0232510 | A1 | 11/2004 | Petruzzello et al. |

OTHER PUBLICATIONS

Tanamoto, T. & Toriumi, A., "A Percolation Approach to Dielectric Breakdown Statistics", *Jpn. J. Appl. Phys.*, v. 36, Part 1, No. 3B, Mar. 1997, pp. 1439-1442.

* cited by examiner

MOSFET

CROSS REFERENCE TO RELATED APPLICATION

This application is based upon and claims the benefit of priority from Japanese Patent Application No. 2005-25607, filed on Feb. 1, 2005, and Japanese Patent Application No. 2006-15154, filed on Jan. 24, 2006, the entire contents of which are incorporated herein by reference.

BACKGROUND OF THE INVENTION

A MOSFET used in, for example an output stage, requires a high breakdown voltage and a low ON resistance. In order to meet these requirements, a MOSFET, which is provided on an insulating layer of an SOI substrate, is generally known.

However, it is hard to obtain a MOSFET having a reduced output capacitance with a high break down voltage and a low ON resistance.

SUMMARY

Aspects of the invention relate to a MOSFET with an active region having a thick portion and a thin portion. In some aspects, the impurity concentration may vary as well. These and other aspects are described below.

BRIEF DESCRIPTIONS OF THE DRAWINGS

DETAILED DESCRIPTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as follows.

General Overview

In one aspect of the present invention, a MOSFET may include an active region of a first conductivity type provided on an insulating layer, the active region having a first portion and a second portion, the first portion being thicker than the second portion; a base region of the first conductivity type provided on the insulating layer, the base region having a higher impurity concentration than the first portion of the active region, the base region being in contact with the first portion of the active region and the insulating layer; a drain region of a second conductivity type provided on the insulating layer, the drain region being in contact with the second portion of the active region and the insulating layer, the drain region being spaced from the base region; a source region of the second conductivity type provided on a surface of the base region; a gate insulating layer provided on the source region, the base region, the active region and the drain region; and a gate electrode provided on the gate insulating layer.

In another aspect of the invention, a MOSFET may include an active region of a first conductivity type provided on an insulating layer, the active region having a first portion, a second portion, the first portion being thicker than the second portion; a base region of the first conductivity type provided on the insulating layer, the base region having a higher impurity concentration than the first portion of the active region, the base region being in contact with the first portion of the active region and the insulating layer; a drain region of a second conductivity type provided on the insulating layer, the drain region being in contact with the second portion of the active region and the insulating layer, the drain region being spaced from the base region; a contact region being in contact with the drain region and having a higher impurity concentration than the drain region, a part of the contact region being thicker than the second portion of the active layer; a source region of the second conductivity type provided on a surface of the base region; a gate insulating layer provided on the source region, the base region, the active region and the drain region; and a gate electrode provided on the gate insulating layer.

First Embodiment

A first embodiment of the present invention will be explained hereinafter with reference to FIGS. 1-6.

Figure 1:
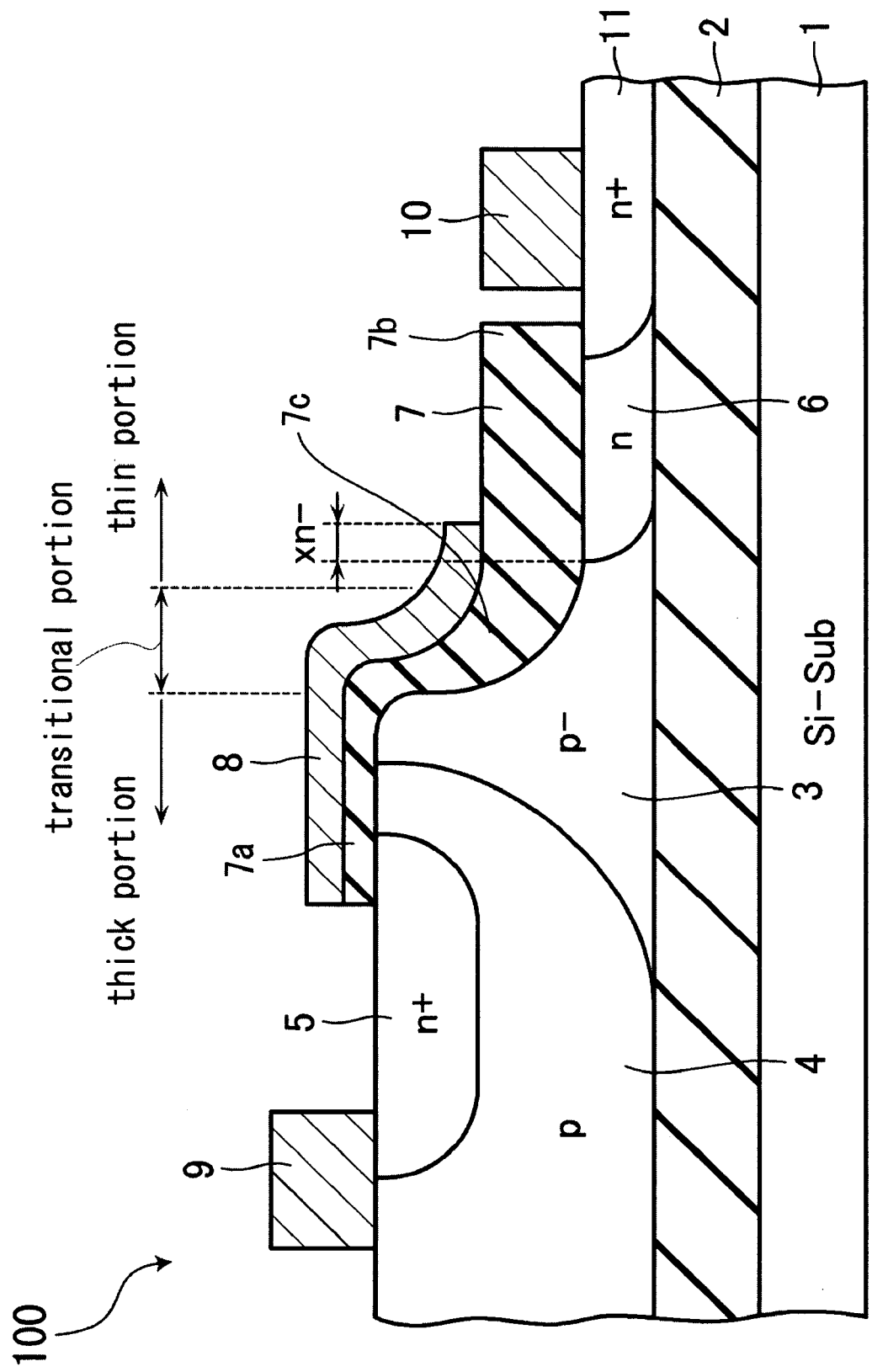
FIG. 1 is a cross sectional view of a MOSFET in accordance with a first embodiment of the present invention.

FIG. 1 a cross sectional view of a MOSFET in accordance with a first embodiment of the present invention. A MOSFET 100 is provided on an SOI substrate. A P⁻-type active region 3, which has a high resistance, is provided on a semiconductor substrate 1 via an SOI insulating layer 2. The active region 3 is provided across almost all of the insulating layer 2 and semiconductor regions 4, 5, 6 and 11 (mentioned below) are formed in the active region 3 by, for example, ion implantation or heat diffusion.

As shown in FIG. 1, the active region 3 has a thick portion and a thin portion, where the thick portion is thicker than the thin portion. In FIG. 1, the thick portion is on the left, the thin portion is on the right. For example, the thin portion may be 0.6 μm or less in thickness. A transitional portion is provided between the thick portion and the thin portion. A thickness of the transitional portion is thinner than the thick portion and thicker than the thin portion. The thickness of the transitional portion at a first portion side is thicker than that at a second portion side.

The thickness of the transitional portion may decrease gradually or continuously from the thick portion to the thin portion. Alternatively, the thickness of the transitional portion may decrease discontinuously, such as step like change, from the thick portion to the thin portion.

A P-type base region 4 is selectively provided in the thick portion of the active region 3 and is contact with the insulating layer 2. The base region 4 has a higher impurity concentration than the active region 3. The base region 4 is configured to block punch through and adjust a threshold voltage of the MOSFET 100.

An N⁺-type source region 5 is selectively provided in a surface part of the base region 4. A source electrode 9 is provided on the source region 5 and the base region 4.

An N-type drain region 6 (an extension region) is selectively provided in the thin portion of the active region 3. The drain region 6 is spaced a predetermined distance, for example 0.5 μm or less, from the base region 4. The drain region 6 is contact with the insulating layer 2.

An N⁺-type contact region 11, which has a higher impurity concentration than the drain region 6, is provided in the thin portion of the active region 3 with being in contact to the drain region 6. The drain region 6 has a lower impurity concentration than the contact region 11 in order to make the MOSFET 100 having a high breakdown voltage. The drain region 6 is in contact with the insulating layer 2. A drain electrode 10 is provided on the contact region 11.

A gate insulating layer 7 is provided on the source region 5, the base region 4, the active region 3, the drain region 6 and the contact region 11. A part of the gate insulating layer 7a, which is provided on the source region 5 and the base region 4, has a substantially constant thickness. A part of the gate insulating layer 7b, which is provided on the drain region 6 and the contact region 11, has a substantially constant thickness. The gate insulating layer 7b is thicker than the gate insulating layer 7a. A part of the insulating layer 7c, which is provided between the gate insulating layers 7a and 7b, has a transitional thickness, which gradually thickens from the gate insulating layer 7a to the gate insulating layer 7b.

A gate electrode 8 is provided on the gate insulating layer 7. An edge of the gate electrode 8 at the source region side corresponds to an edge of the gate insulating layer 7. An edge of the gate electrode 8 at the drain region side is not corresponding to an edge of the gate insulating layer 7. At the drain region side, an edge of the gate electrode 8 is recessed from the edge of the gate insulating layer 7, and the gate electrode 8 covers a part of the drain region 6. As shown in FIG. 1, the gate electrode 8 overlaps the drain region 6 with a length xn–.

In this embodiment, the drain region 6 contacts the insulating layer 2 and provided in a thin portion of the active region 3. So, a PN junction area between the P type active region 3 and the N type drain region 6 is small and is decreased in comparison to a later described comparative example. A capacitance Cds between source and drain, or an output capacitance may be decreased or made small.

In this embodiment, a depleted region, which is generated in a PN junction between the between the P type active region 3 and the N type drain region 6 may be capable of extending greatly near the PN junction, since the active region 3 has a low impurity concentration and a high resistance. A length of the depletion region is enlarged, so the source-drain capacitance may be decreased.

Figure 27:
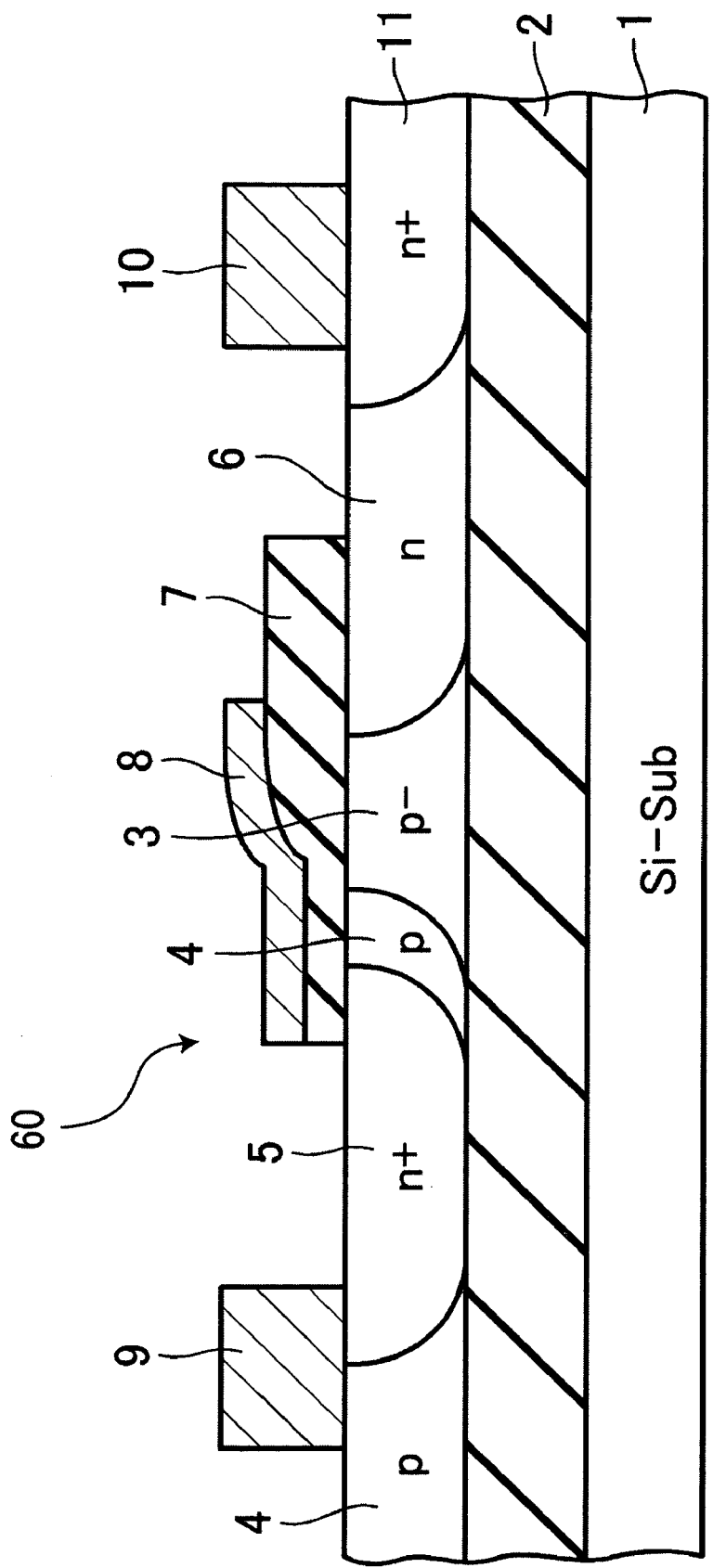
FIG. 27 is a graph showing a relation a thickness of an active region and a capacitance between a source region and the drain region in a MOSFET of FIG. 26.
Figure 28:
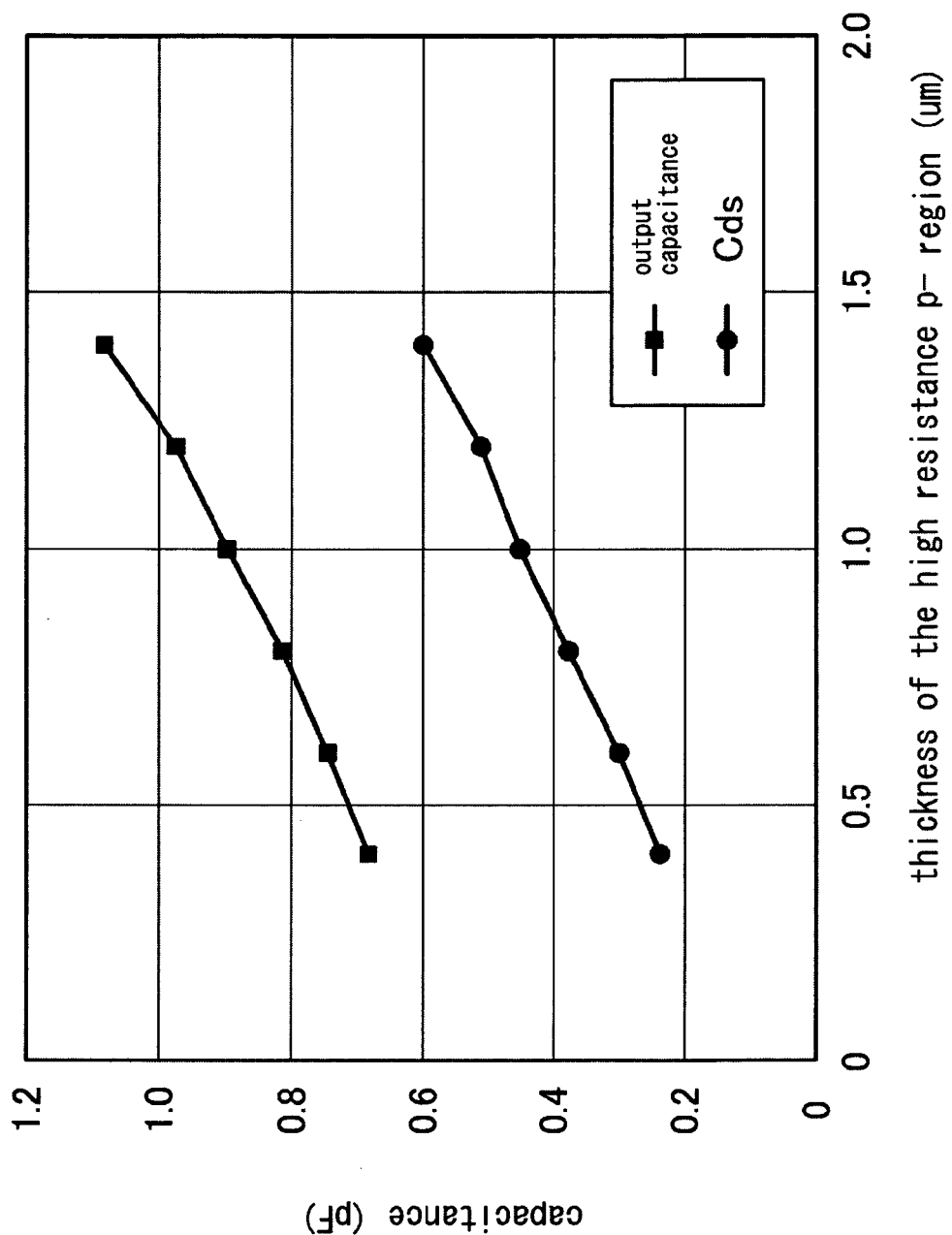
FIG. 28 is a graph showing capacitance as a function of the thickness of the high resistance p- region in the MOSFET of FIG. 26.

A comparative example will be explained hereinafter with reference to FIGS. 26-28.

Figure 26:
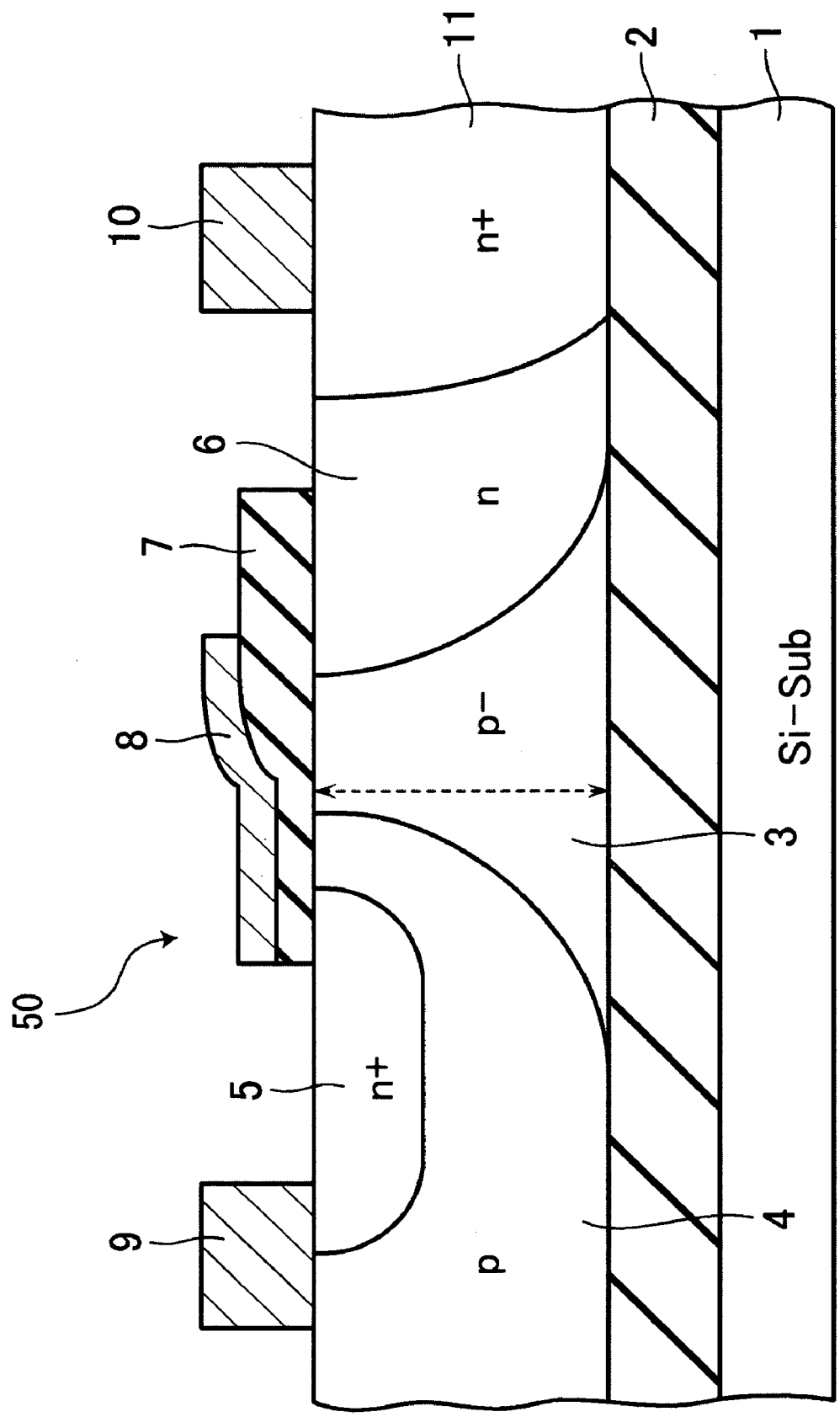
FIG. 26 is a cross sectional view of a MOSFET in accordance with a comparative example.

FIG. 26 is across sectional view of a MOSFET 50 shown in U.S. Pat. No. 6,943,406. With respect to each portion of this comparative example, the same or corresponding portions of the MOSFET of the first embodiment shown in FIG. 1 are designated by the same reference numerals, and explanation of such portions is omitted.

In the MOSFET 50, the active region 3 has a substantially uniform thickness on the insulating layer 2. In this MOSFET 50, a PN junction area between the P-type active region 3 and the N-type drain region 6 is large. The PN junction area is substantially same as a junction area between the P⁻-type active region 3 and the P-type base region 4. Thus the output capacitance of the MOSFET 50 may be large. If the whole thickness of the active region 3 is thinned as shown in FIG. 27, the PN junction area between the P type active region 3 and the N-type drain region 6 is reduced. A drain-source capacitance Cds may be decreased and the output capacitance may be also decreased as shown in FIG. 28.

However, if the thickness of the active region 3 is reduced to, for example 0.5 μm or less, a bottom of the source region 5 may contact with the insulating layer 2 and the base region 4 may be divided into two parts by the source region 5 in the cross sectional view. In this case, the electric potential of the active region 3 or the base region 4 may be unstable. It may be hard to reduce output capacitance by thinning the whole thickness of the active region 3.

Where a part of the base region 4 is extended toward the drain region 6 for obtaining stability of the electric potential, a channel region is shortened and an ON resistance may be increased. Thus, it is hard to reduce output capacitance up to about 0.9 pF or below in the MOSFET 50 of the comparative example as shown in FIG. 27.

Figure 2:
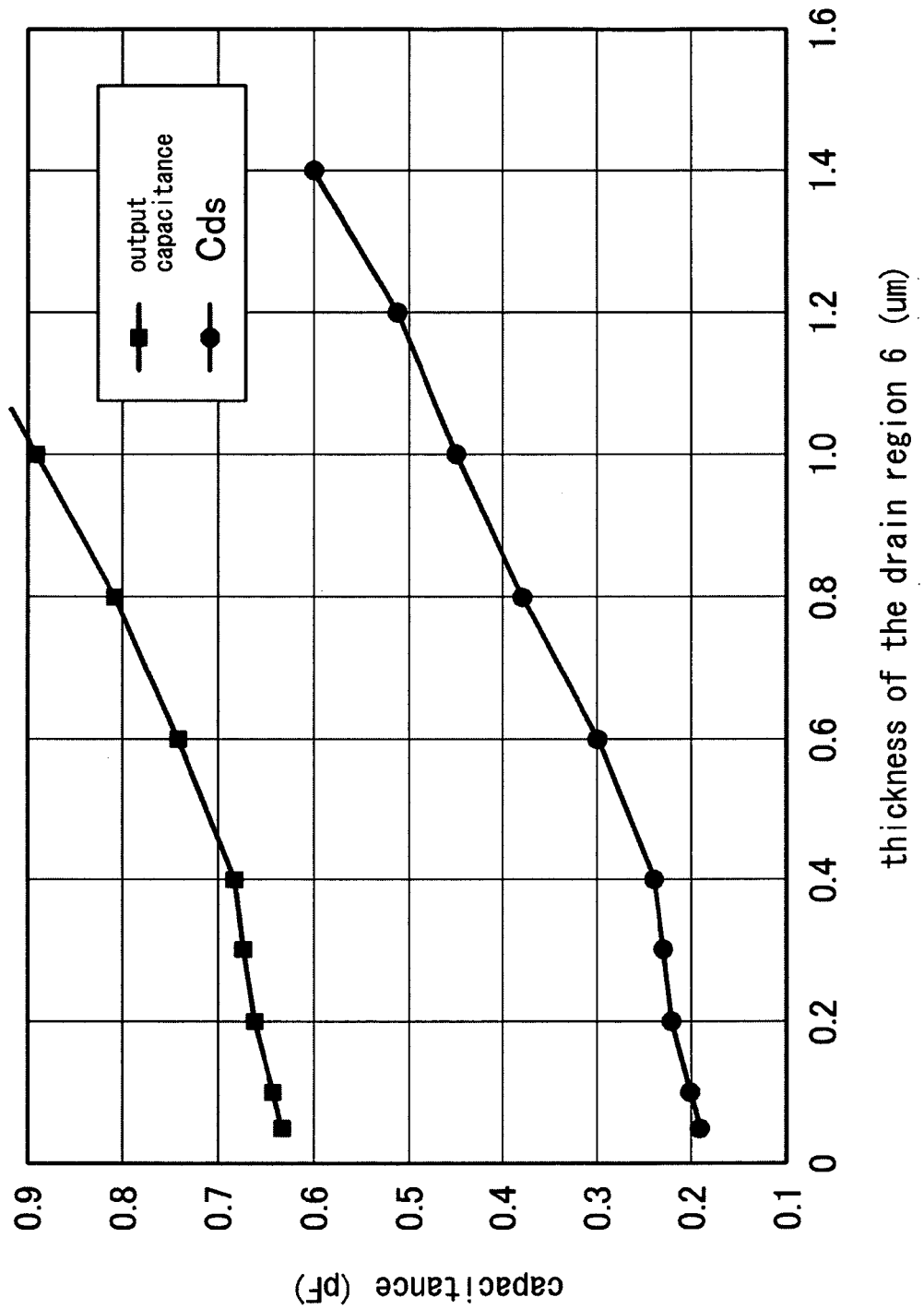
FIG. 2 is a graph showing a relation a thickness of a drain region, and a capacitance Cds between a source region and the drain region or output capacitance in a MOSFET of FIG. 1.

However, in comparison to the comparative example, in the first embodiment, the source region 5 is contact with the insulating layer 2, since the base region 3 is provided in the thick portion of the active region 3. On the other hand, the PN junction area between the active region 3 and the drain region 6 is reduced, since the drain region 6 is provided in the thin portion of the active region 3, FIG. 2 is a graph showing a relation of thickness of a drain region 6 and a capacitance Cds between a source region 5 and the drain region 6 or output capacitance in the MOSFET 100. Where the thickness of the base region 4 is about 1.0-1.4 μm, the drain region 6 may be thinned to about 0 μm. In this case the output capacitance may be reduced to 0.63 pF. Therefore, the output capacitance is reduced about 30% as against the comparative example. In accordance with this first embodiment, the MOSFET may be obtained, which has a low output capacitance with a high breakdown voltage and a low ON resistance and is capable of keeping a stable electric potential at the base region 4 or the active region 3.

A manufacturing process of the MOSFET 100 in the first embodiment will be explained hereinafter with reference to FIGS. 3-6.

Figure 3:
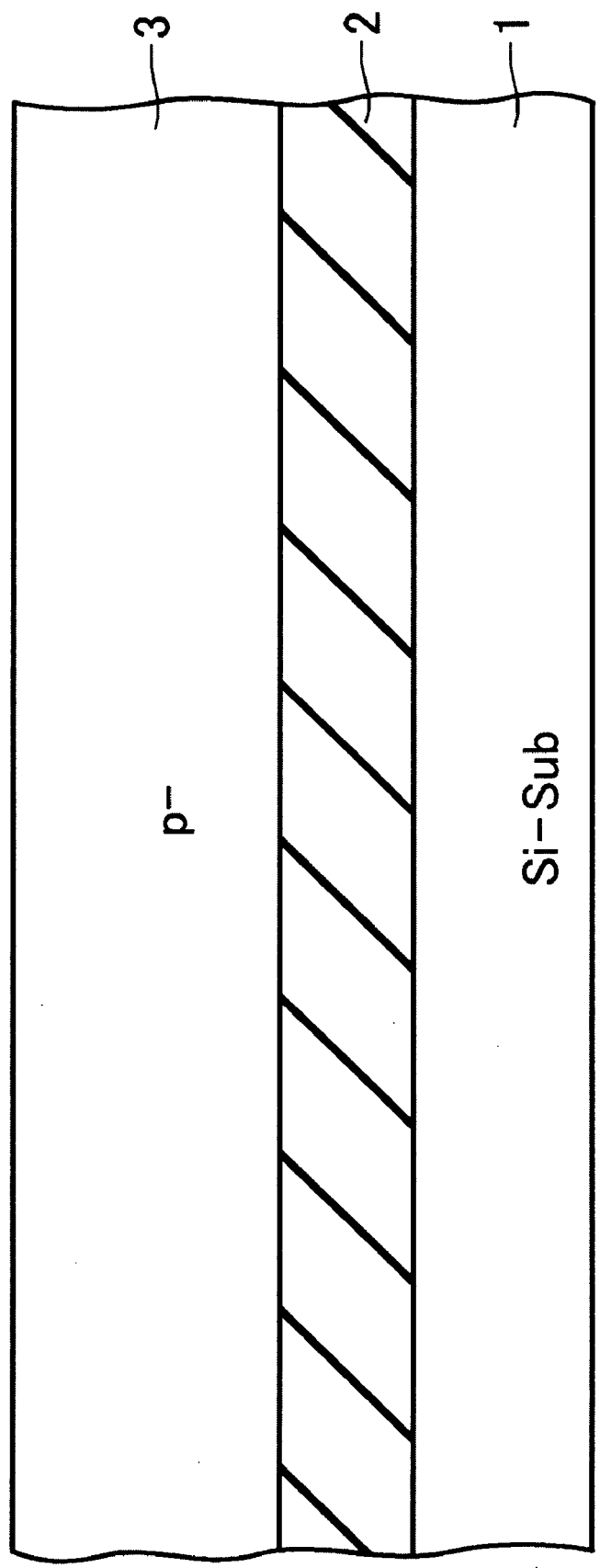
FIGS. 3-6 are cross sectional views of a part of a manufacturing process of the MOSFET of the first embodiment.

As shown in FIG. 3, an SOI substrate is prepared, in which the active region 3 is provided on the semiconductor substrate 1 via the insulating layer 2.

Figure 4:
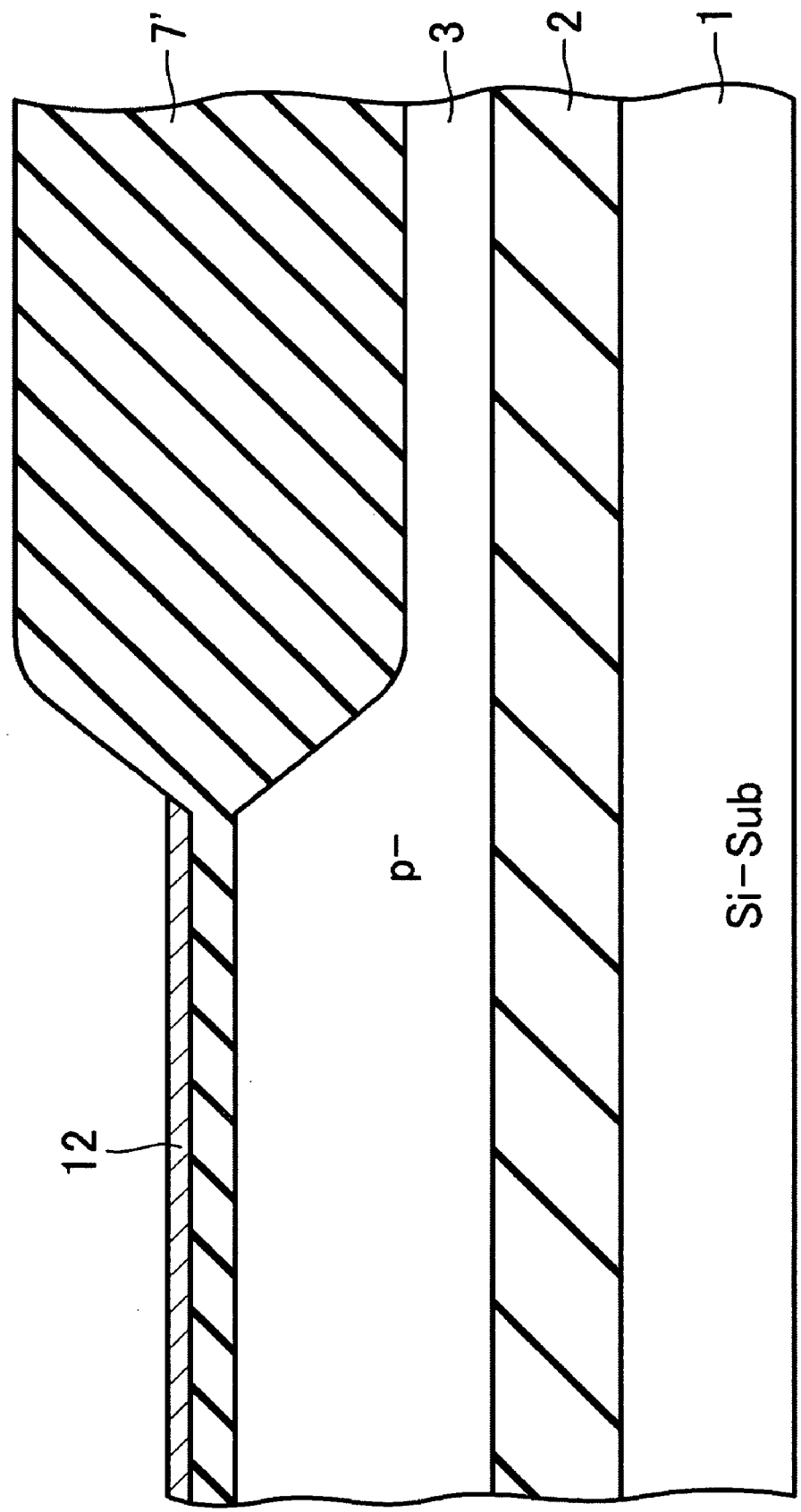

As shown in FIG. 4, a silicon oxide 7' is wholly provided on the active region 3. A silicon nitride 12 is selectively provided on the silicon oxide 7'. The silicon nitride 12 provided portion corresponds to the thick portion of the active region 3. The LOCOS oxidization is operated and a part of the active region 3 below the exposed silicon oxide 7' is thinned by oxidization. So, the thin portion of the active region 3 is provided. The transitional portion in thickness of the active region 3, which is a boundary between the silicon nitride 12 provided portion and not provided portion, has a bird's peak shape.

Figure 5:
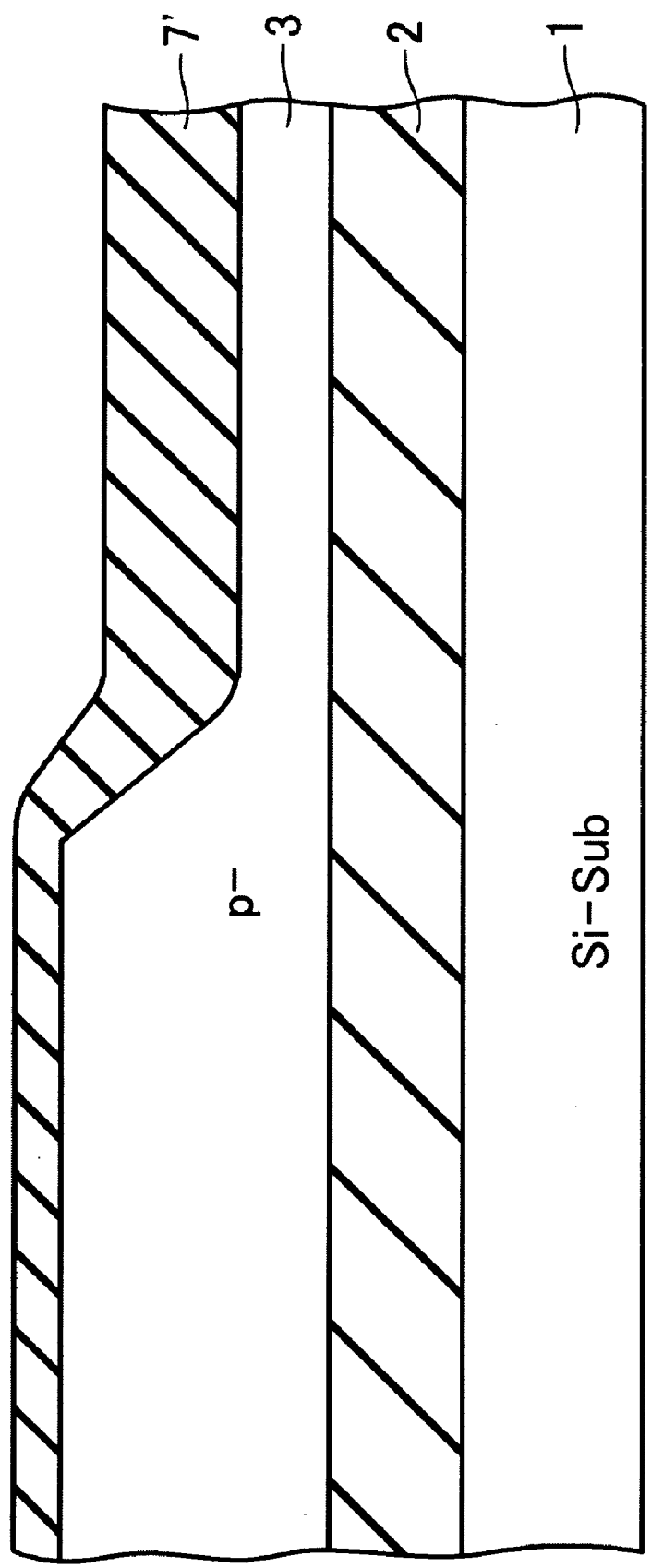

As shown in FIG. 5, the silicon nitride 12 is removed. The silicon oxide 7' is etched by photolithography. The silicon oxide 7' on the thick portion (left in FIG. 5) of the active region 3 is large in thickness and the silicon oxide 7' on the thin portion (right in FIG. 5) of the active region 3 is small in thickness.

Figure 6:
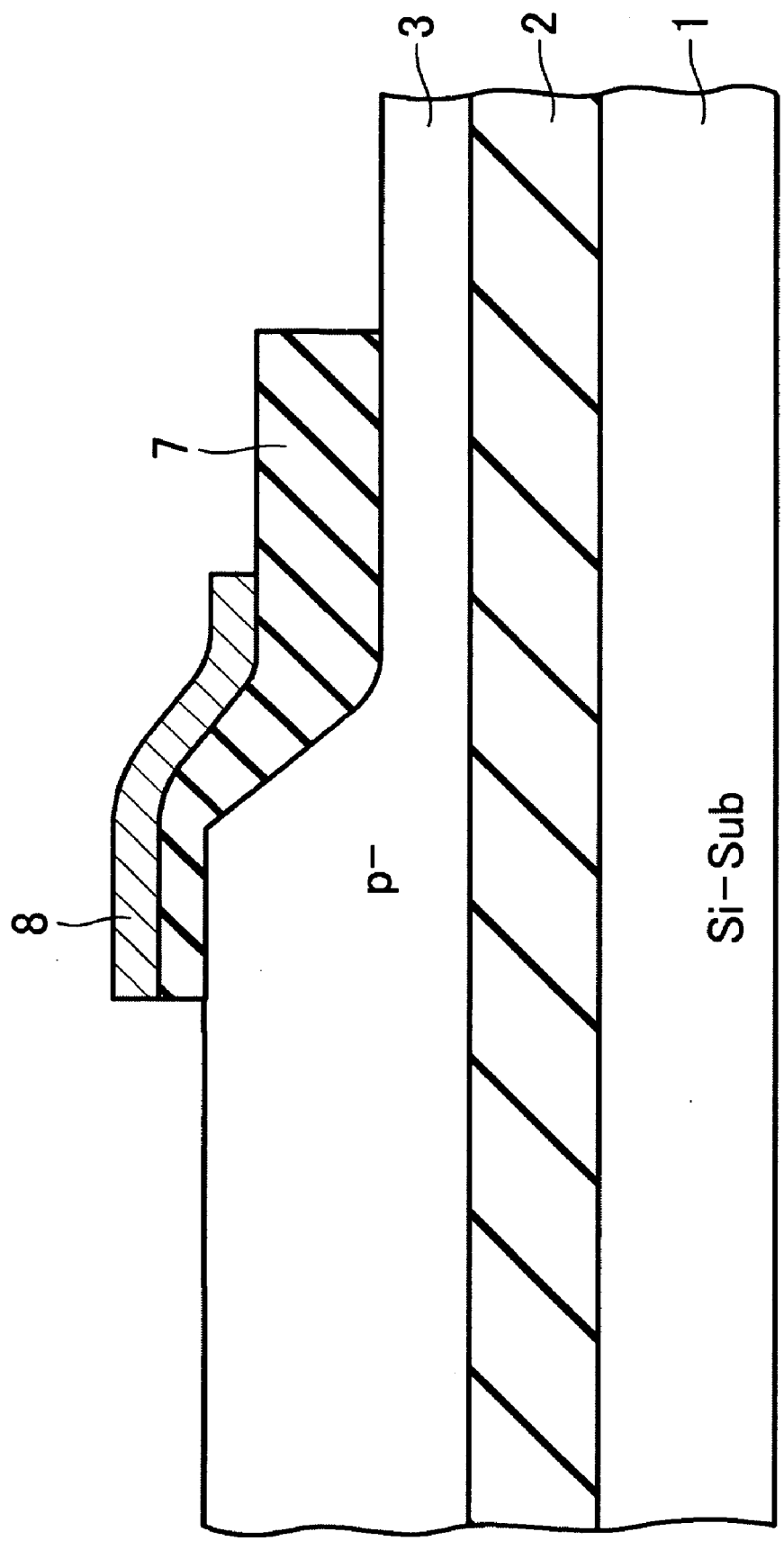

As shown in FIG. 6, the gate insulating layer 7 is created by selectively etching the silicon oxide 7'. The gate electrode 8, which is, for example made of polysilicon, is provided on the gate insulating layer 7. Semiconductor regions 4, 5, 6 and 11 can be created, for example, by ion implantation into the active region 3 with using a mask on the gate insulating layer 7 and the gate electrode 8. So, the MOSFET 100 shown in FIG. 1 is obtained.

Second Embodiment

Figure 7:
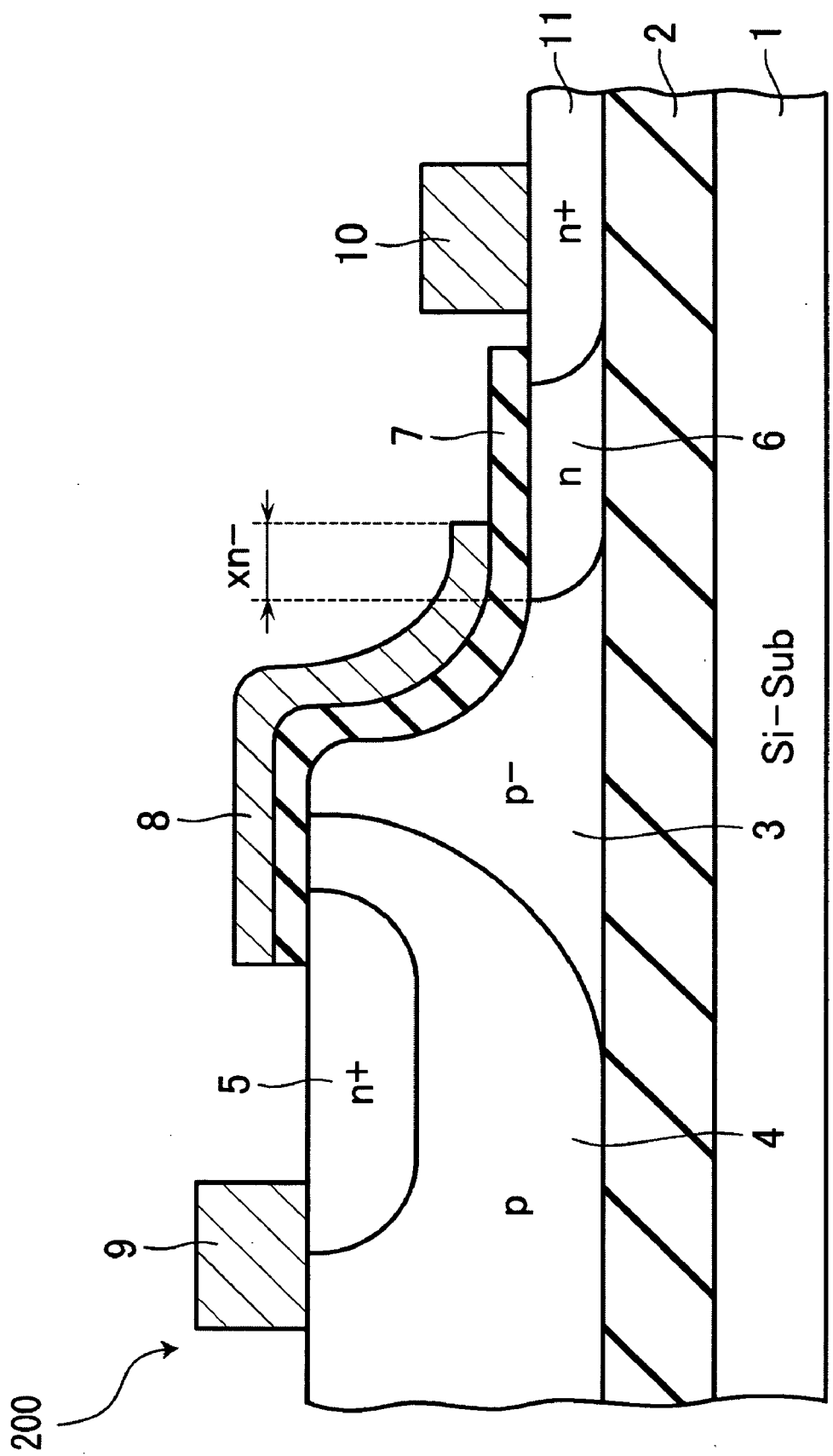
FIG. 7 is a cross sectional view of a MOSFET in accordance with a second embodiment of the present invention.

A second embodiment is explained with reference to FIG. 7.

A MOSFET 200 is described in accordance with a second embodiment of the present invention. With respect to each portion of this embodiment, the same or corresponding portions of the MOSFET of the first embodiment shown in FIGS. 1-6 are designated by the same reference numerals, and explanation of such portions is omitted.

In this second embodiment, the gate insulating layer 7 has a substantially uniform thickness on the first portion and the second portion of the active region 3. The substantially uniform thickness gate insulating layer 7 may be formed by, for example low pressure CVD.

Third Embodiment

Figure 8:
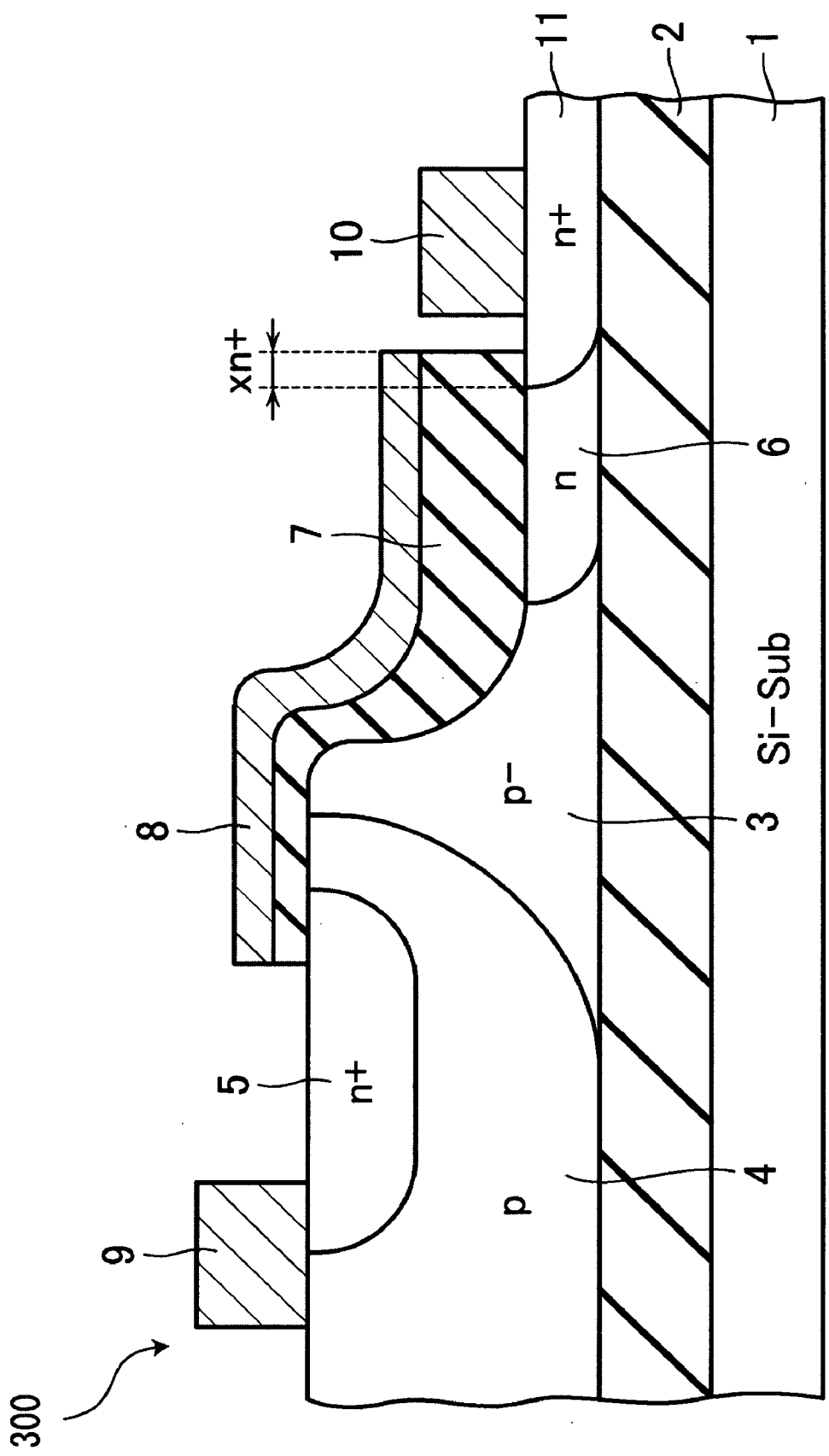
FIG. 8 is a cross sectional view of a MOSFET in accordance with a third embodiment of the present invention.

A third embodiment is explained with reference to FIG. 8.

A MOSFET 300 is described in accordance with a third embodiment of the present invention. With respect to each portion of this embodiment, the same or corresponding portions of the MOSFET of the first or second embodiment shown in FIGS. 1-7 are designated by the same reference numerals, and explanation of such portions is omitted.

In this third embodiment, the gate electrode 8 is extended onto the contact region 11.

The gate electrode 8 covers the contact region 11 with a length xn+. A carrier concentration in the drain region 6 is increased in comparison to the MOSFET 100, when the gate voltage is added and the MOSFET 300 is ON state. So, ON resistance of the MOSFET 300 may be reduced.

Fourth Embodiment

Figure 9:
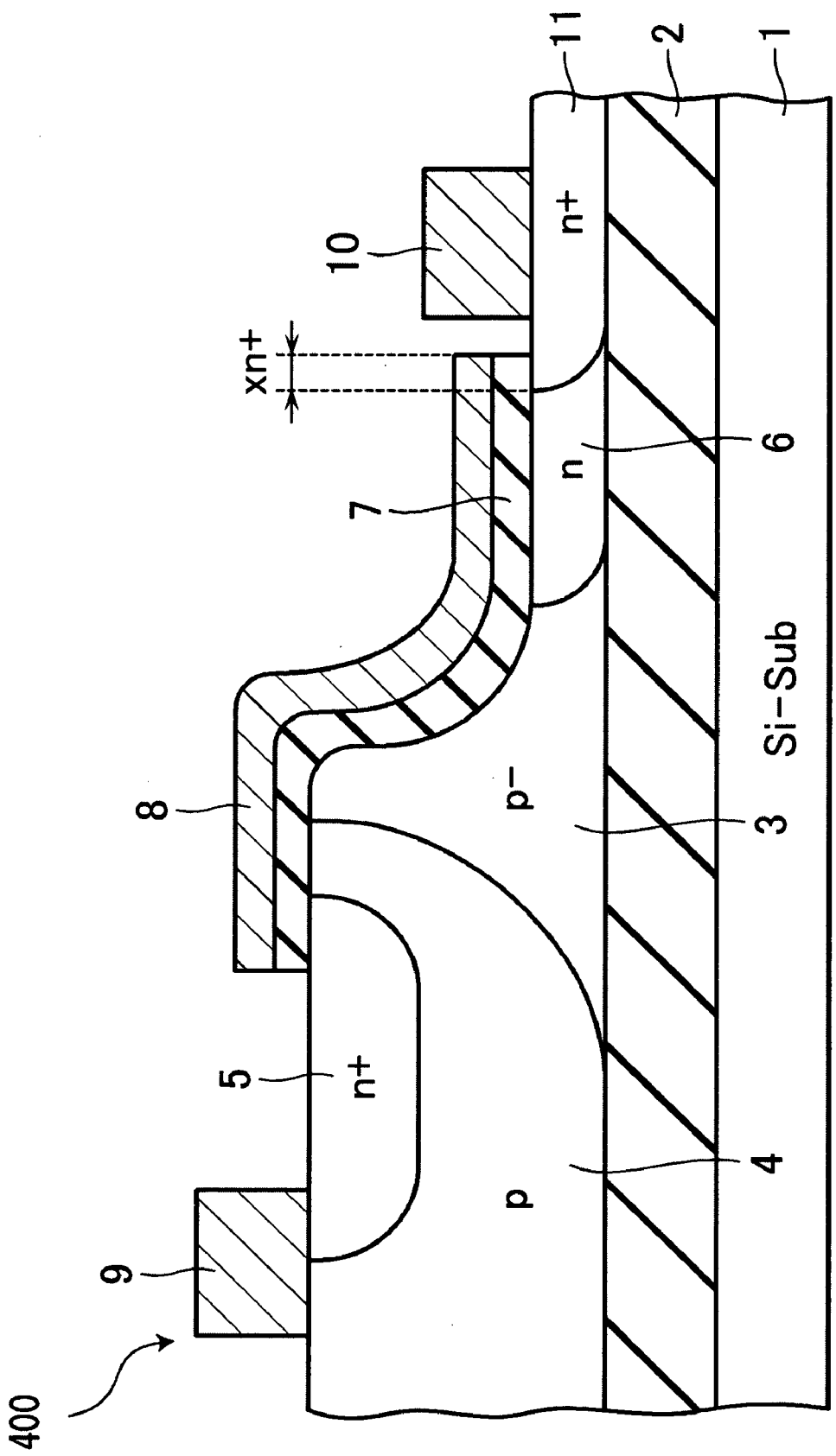
FIG. 9 is a cross sectional view of a MOSFET in accordance with a fourth embodiment of the present invention.

A fourth embodiment will be explained with reference to FIG. 9.

A MOSFET 400 in accordance with a fourth embodiment of the present invention, with respect to each portion of this embodiment, the same or corresponding portions of the MOSFET of the first, second or third embodiment shown in FIGS. 1-8 are designated by the same reference numerals, and its explanation of such portions is omitted.

In this fourth embodiment, the gate electrode 8 is extended onto the contact region 11. The gate electrode 8 covers the contact region 11 with a length xn+. In contrast to the third embodiment, the gate insulating layer 7 has a substantially uniform thickness.

Fifth Embodiment

A fifth embodiment will be explained with reference to FIG. 10.

A MOSFET 500 in accordance with a fifth embodiment of the present invention, with respect to each portion of this embodiment, the same or corresponding portions of the MOSFET of the first, second, third or fourth embodiment shown in FIGS. 1-9 are designated by the same reference numerals, and its explanation of such portions is omitted.

In this fifth embodiment, the gate electrode 8 is extended onto the contact region 11. The gate electrode 8 covers the contact region 11 with a length xn+. In contrast to the third or fourth embodiment, in the MOSFET 500, the gate insulating layer 7 extends further towards the contact region 11 than the gate electrode 8. A part of the gate insulating layer 7 on the contact region 11 is not covered with the gate electrode 8.

In this fifth embodiment, a creepage distance between the gate electrode 8 and the drain electrode 10 is expanded. So, the breakdown voltage of the MOSFET 500 is improved.

Sixth Embodiment

Figure 11:
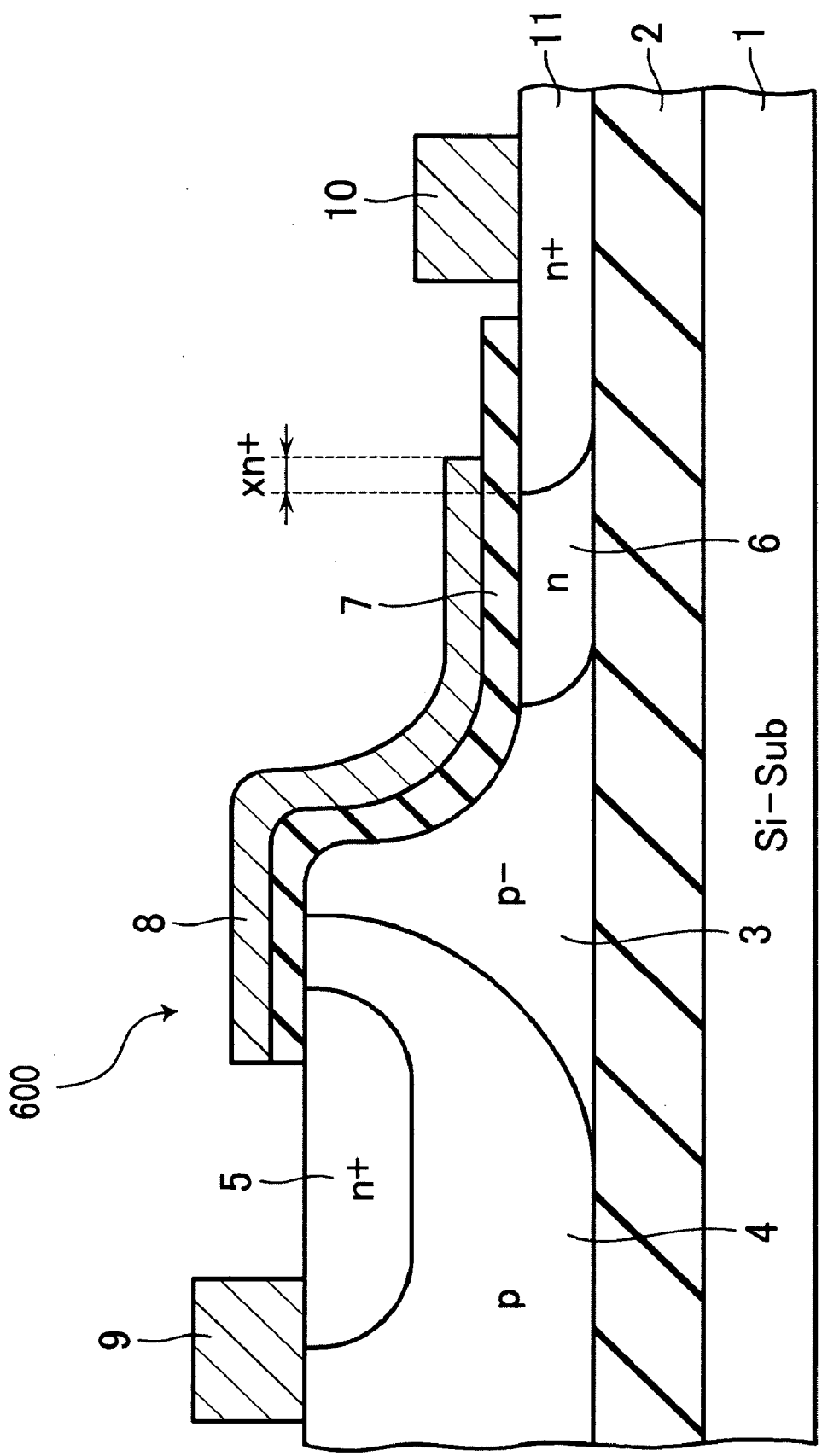
FIG. 11 is a cross sectional view of a MOSFET in accordance with a sixth embodiment of the present invention.

A sixth embodiment will be explained with reference to FIG. 11.

A MOSFET 600 in accordance with a sixth embodiment of the present invention, with respect to each portion of this embodiment, the same or corresponding portions of the MOSFET of the first, second, third, fourth or fifth embodiment shown in FIGS. 1-10 are designated by the same reference numerals, and its explanation of such portions is omitted.

Figure 10:
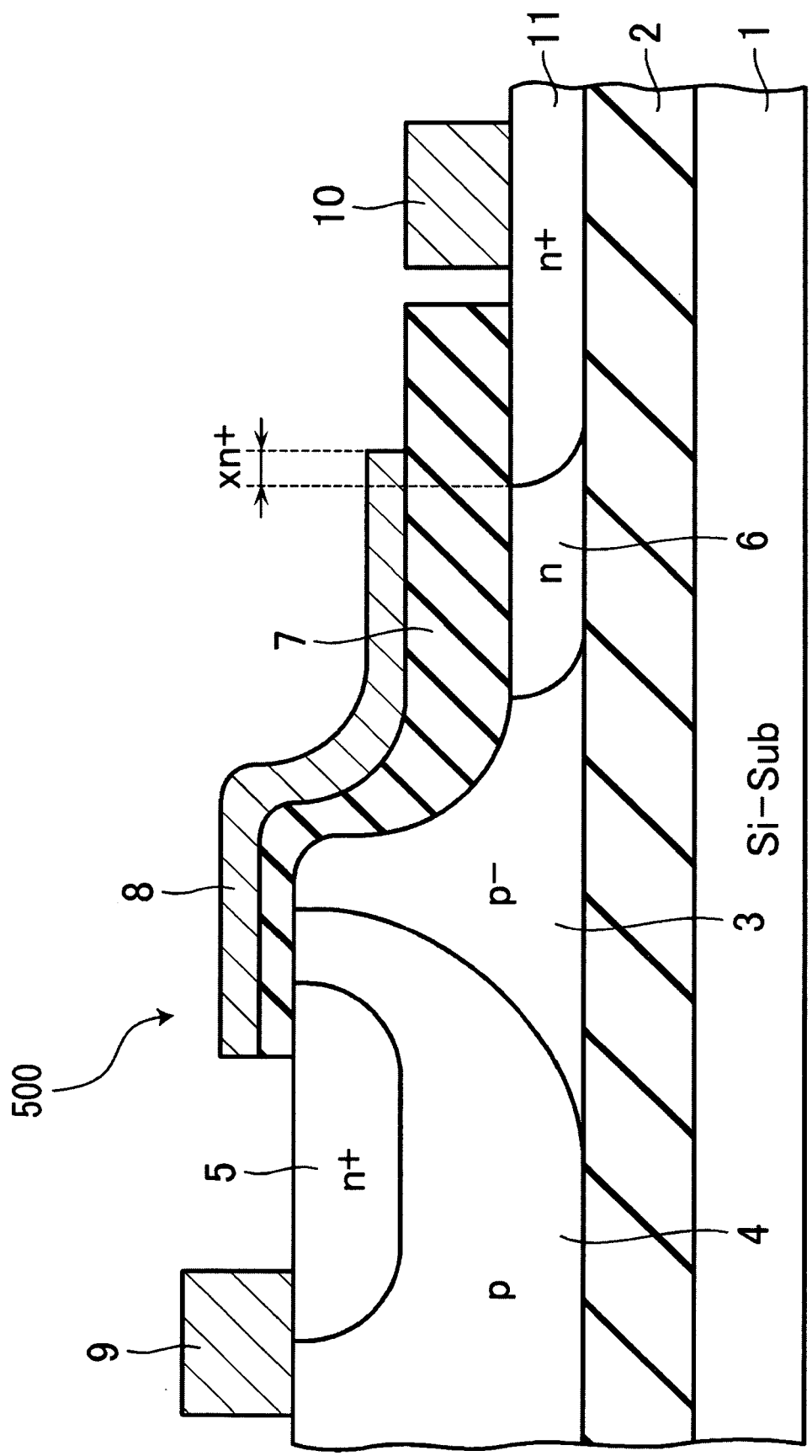
FIG. 10 is a cross sectional view of a MOSFET in accordance with a fifth embodiment of the present invention.

On the contrary to the MOSFET 500 of the fifth embodiment shown in FIG. 10, in the MOSFET 600, the thickness of the gate insulating layer 7 has a substantially uniform thickness from the thick portion of the active region 3 to the thin portion of the active region 3. Another structure is similar to the MOSFET 500.

Seventh Embodiment

A seventh embodiment will be explained with reference to FIGS. 12-19.

A MOSFET 700 in accordance with a seventh embodiment of the present invention, with respect to each portion of this embodiment, the same or corresponding portions of the MOSFET of the first, second, third, fourth, fifth or sixth embodiment shown in FIGS. 1-11 are designated by the same reference numerals, and its explanation of such portions is omitted.

Figure 12:
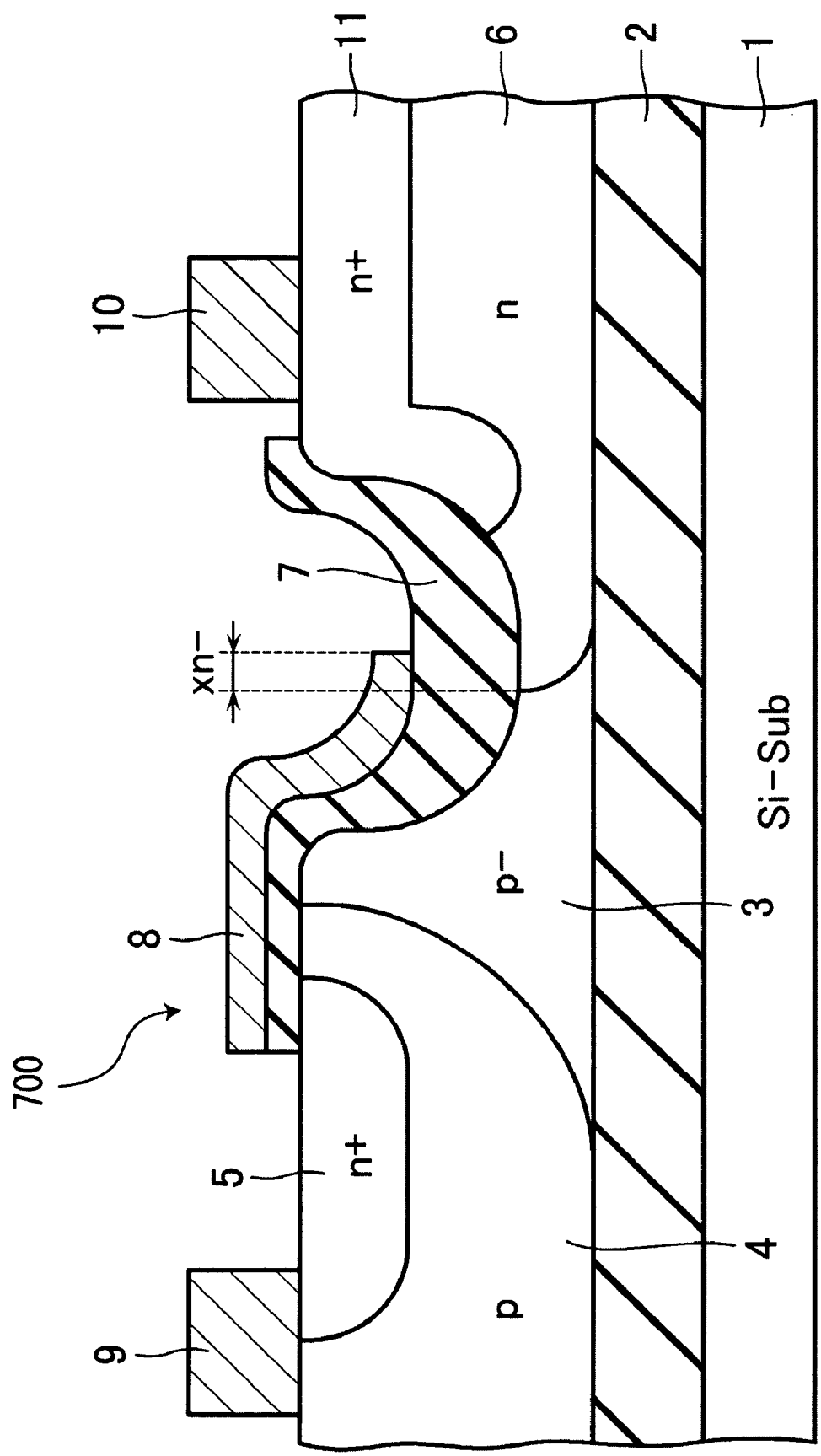
FIG. 12 is a cross sectional view of a MOSFET in accordance with a seventh embodiment of the present invention.

A structure of the MOSFET 700 will be explained with reference to FIG. 12.

In the first to the sixth embodiments, the drain region 6 and the contact region 11 are provided in the thin portion of the active region 3. In contrast to the first to the sixth embodiments, the drain region 6 and the contact region 11, except for near the PN junction between the active region 3 and the drain region 6, are provided in a thick portion of the active region 3. The output capacitance depends on the junction area between the active 3 and the drain region 6. So, the output capacitance may be reduced if the PN junction is provided in the thin portion.

On the other hand, the thickness of the contact region 11 of this seventh embodiment is thicker than that of the first to sixth embodiments, since the contact region 11 is provided in the thick portion of the active region 3. So, the maximum solubility of the Si in impurity doping is higher than the impurity doping in the first to sixth embodiments. Furthermore, in this seventh embodiment, a junction area between the drain region 6 and the contact region 11 is larger than that of the first to sixth embodiments. So, the ON resistance is decreased.

Alternatively, the junction between the drain region 6 and the contact region 11 may be provided in the thinnest part of the active region 3. So, the output capacitance may be decreased.

A manufacturing process of the MOSFET 700 in accordance with this embodiment will be explained hereinafter with reference to FIGS. 13-16.

Figure 13:
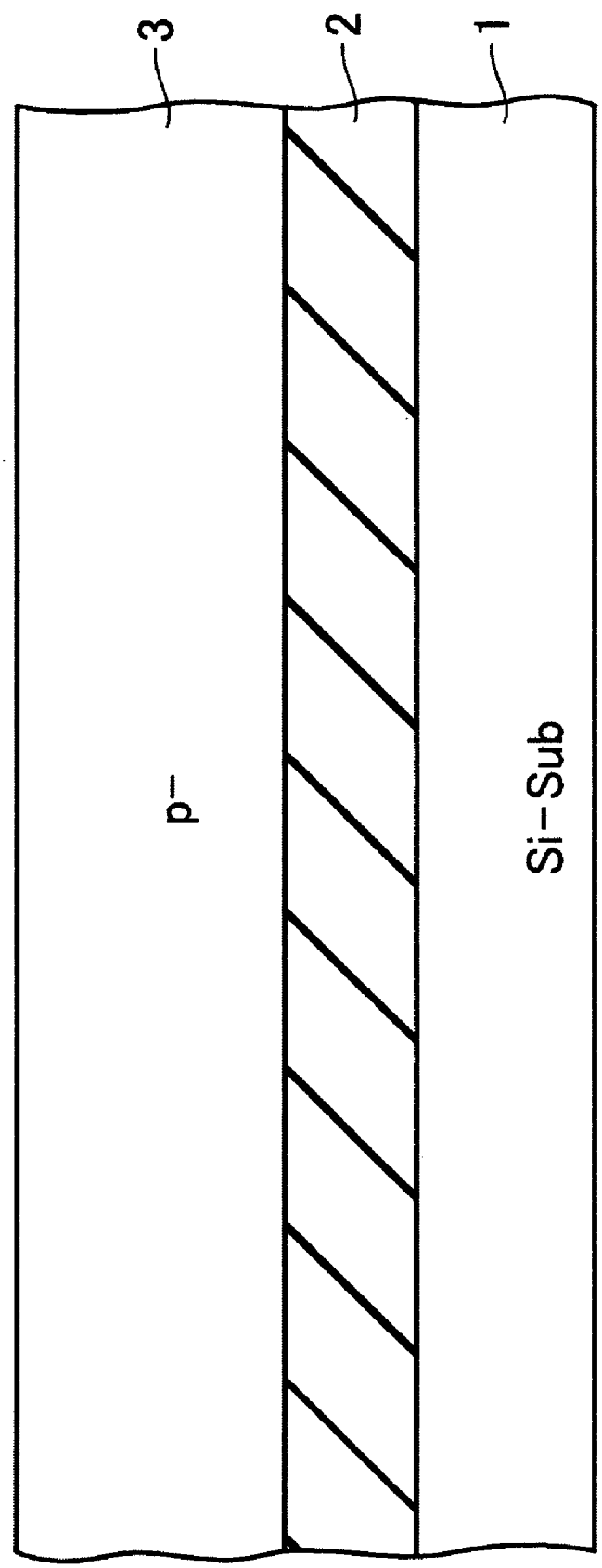
FIGS. 13-18 are cross sectional views of a part of a manufacturing process of the MOSFET of the seventh embodiment.

As shown in FIG. 13, an SOI substrate, in which the active region 3 is provided on the semiconductor substrate 1 via the insulating layer 2 is prepared.

Figure 14:
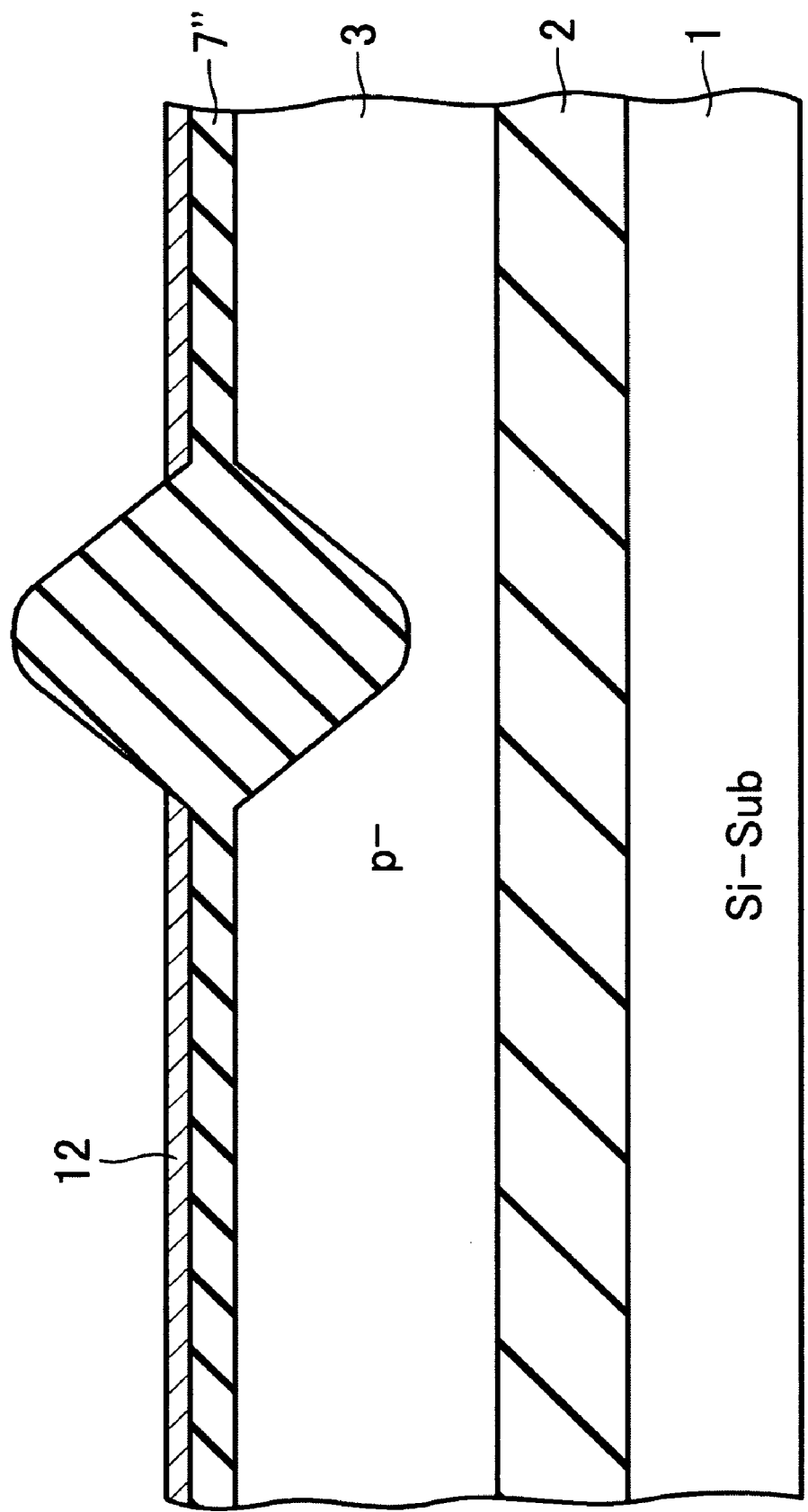

As shown in FIG. 14, a silicon oxide 7" is wholly provided on the active region 3. A silicon nitride 12 is selectively provided on the silicon oxide 7". The silicon nitride 12 provided portion is corresponding to the thick portion of the active region 3. The LOCOS oxidization is operated and a part of the active region 3 below the exposed silicon oxide 7" is thinned by oxidization. In this manufacturing process, the thin part of the active region 3 is provided around the PN junction between the active region 3 and the drain region 6

Figure 15:
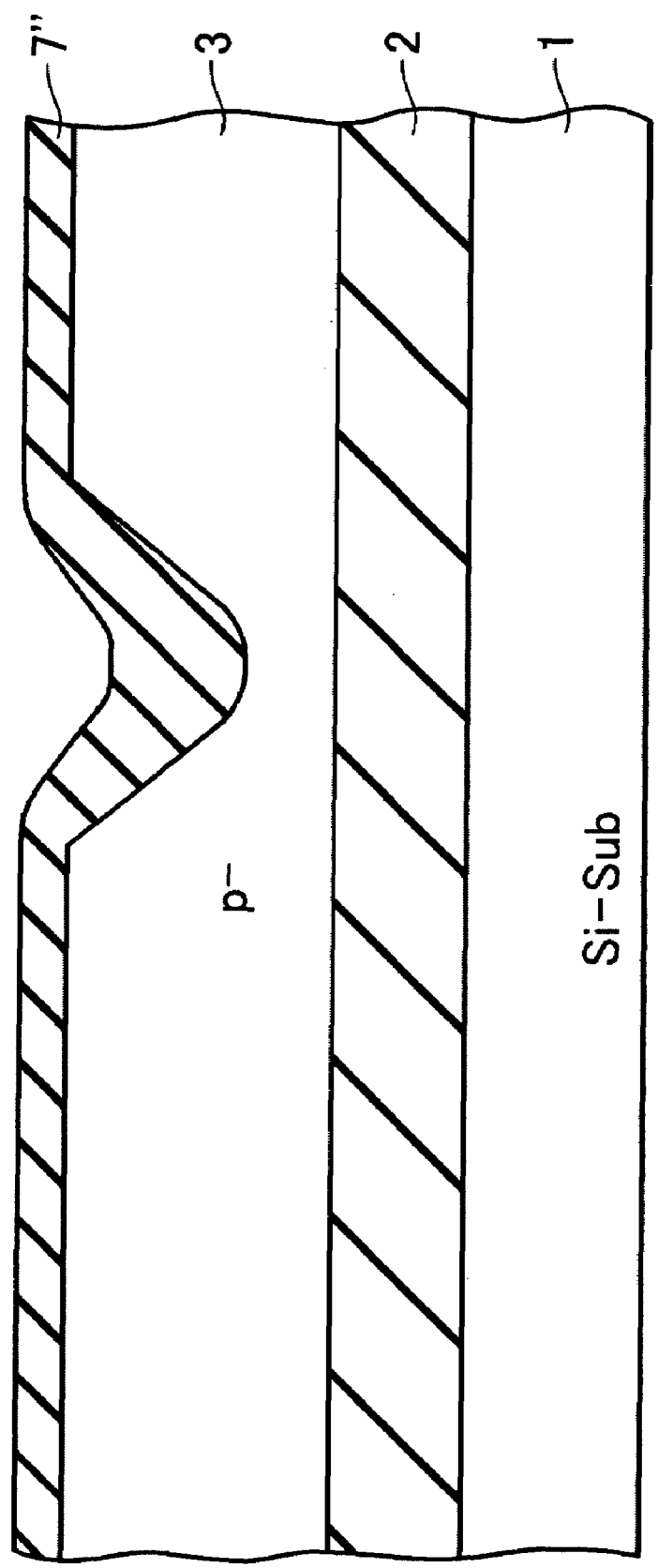

As shown in FIG. 15, a thick portion of the silicone oxide 7", which is provided on the thin portion of the active region 3, is etched by using photolithography. A thick silicon oxide 7" is provided on the thin portion of the active region 3.

Figure 16:
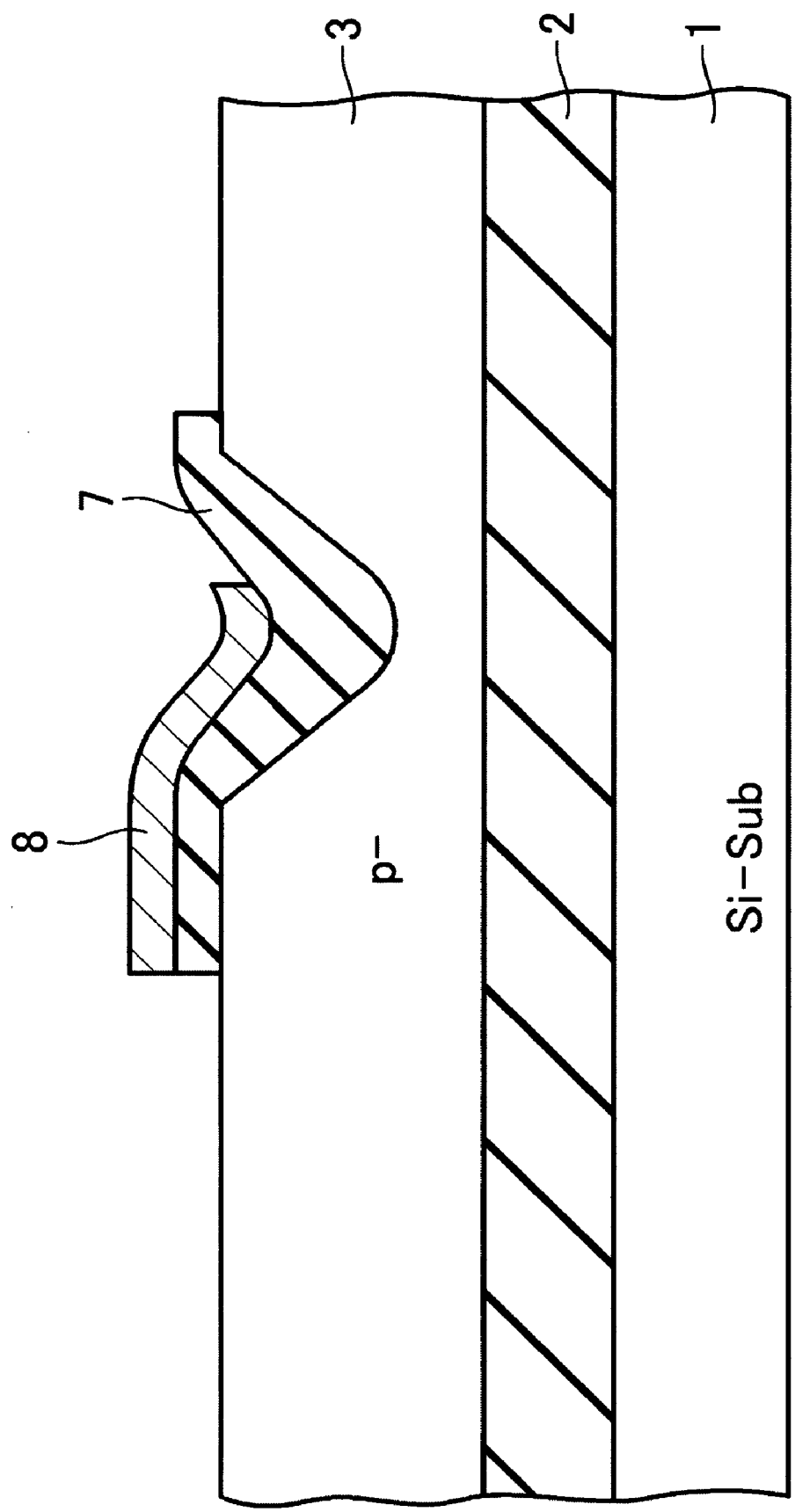

As shown in FIG. 16, the gate insulating layer 7 is created by selectively etching the silicon oxide 7". The gate electrode 8, which can be, for example made of polysilicon, is provided on the gate insulating layer 7 with a part of the gate insulating layer 7 being exposed. Semiconductor regions 4, 5, 6 and 11 can be provided by ion implantation into the active region 3 using a mask on the gate insulating layer 7 and the gate electrode 8. So, the MOSFET 700 shown in FIG. 12 is obtained.

Modified Embodiment of the Seventh Embodiment

A modified embodiment of the seventh embodiment will be explained with reference to FIGS. 17-19.

A MOSFET 750 in accordance with a modified embodiment of the seventh embodiment of the present invention, with respect to each portion of this embodiment, the same or corresponding portions of the MOSFET of the first, second, third, fourth, fifth, sixth or seventh embodiment shown in FIGS. 1-16 are designated by the same reference numerals, and its explanation of such portions is omitted.

Figure 19:
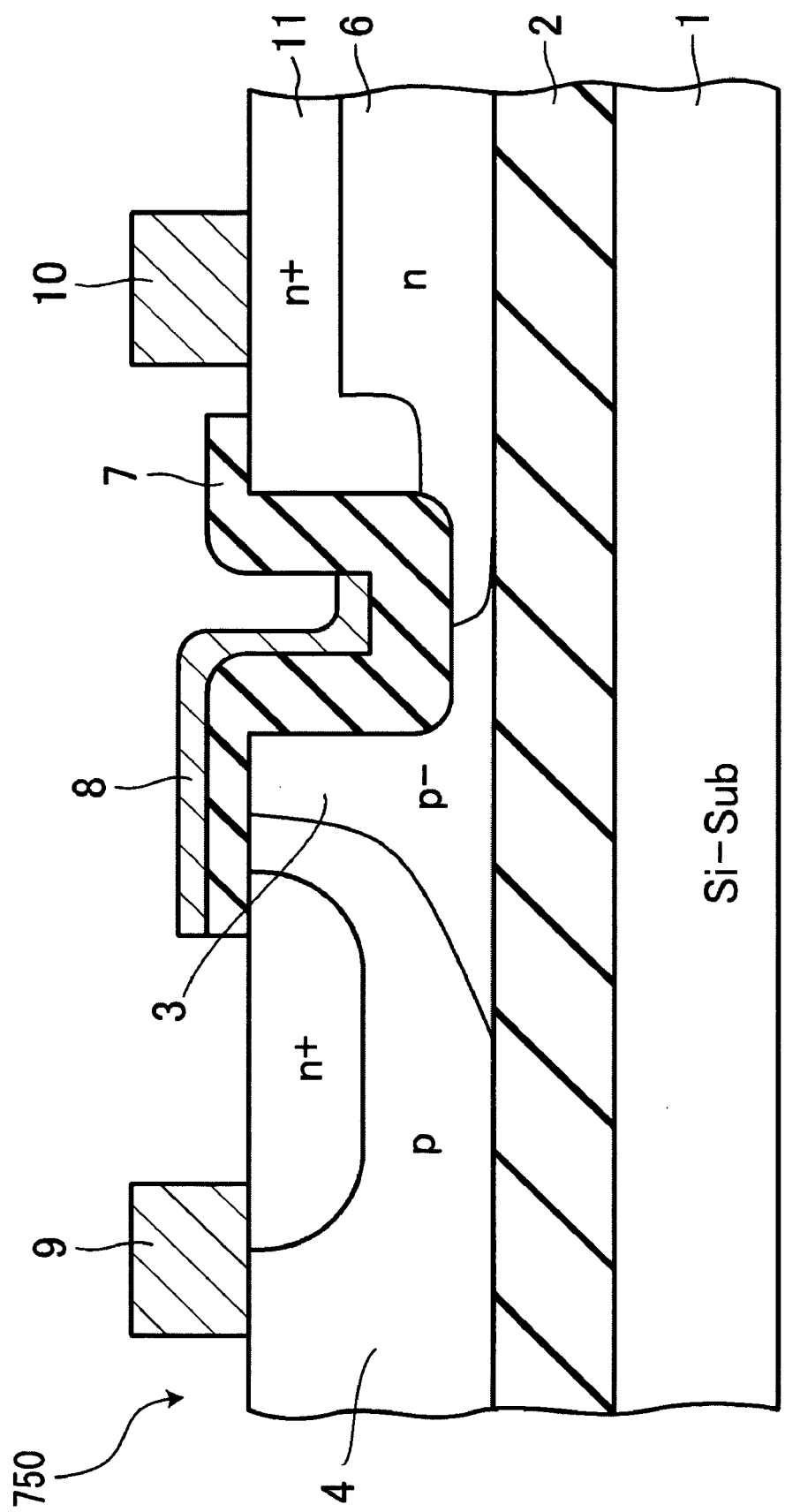
FIG. 19 is a cross sectional view of a MOSFET in accordance with a modified embodiment of the seventh embodiment of the present invention.

As shown in FIG. 19, in contrast to the MOSFET 700, a thickness of the active region may have a step-like change in the MOSFET 750. The PN junction between the active region 3 and the drain region 6 is provided in the thin portion of the active region 3.

A manufacturing process of the MOSFET 750 in accordance with this modified embodiment will be explained hereinafter with reference to FIGS. 17-19.

Figure 17:
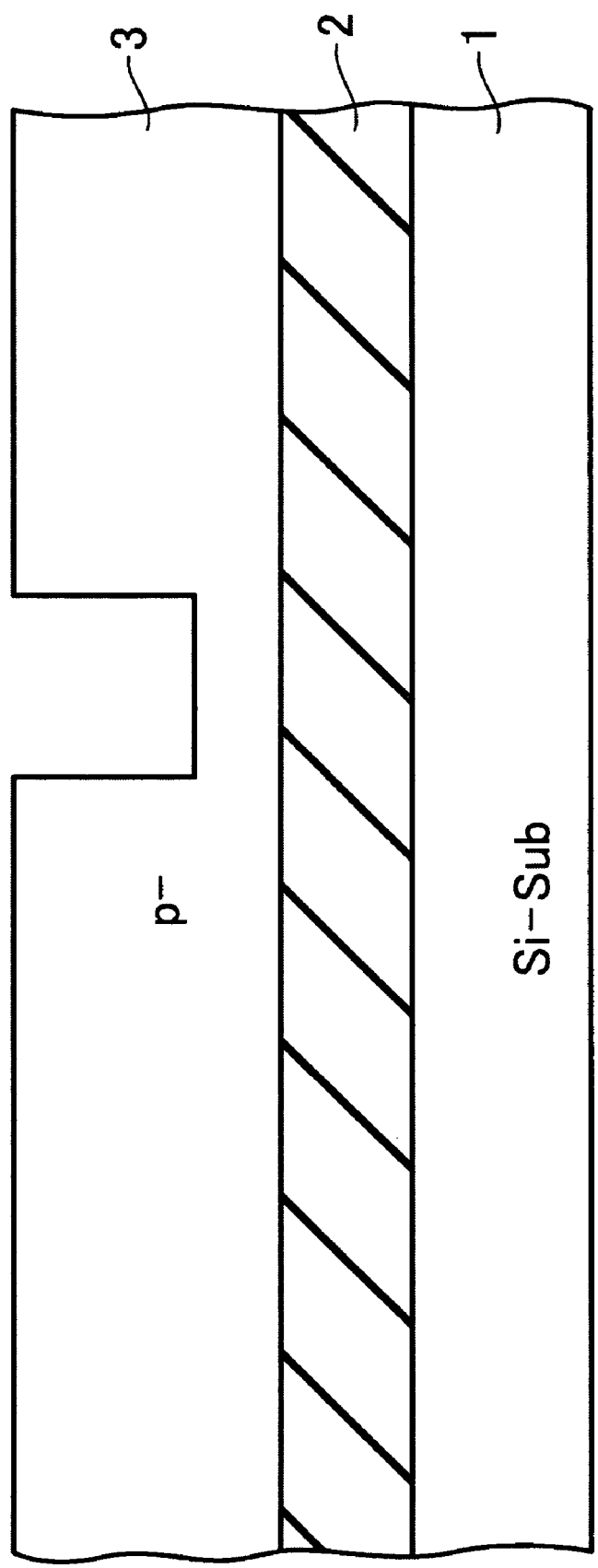

As shown in FIG. 17, a trench is provided on the active region 3. The thin portion and the thick portion are provided in the active region 3 by the trench.

Figure 18:
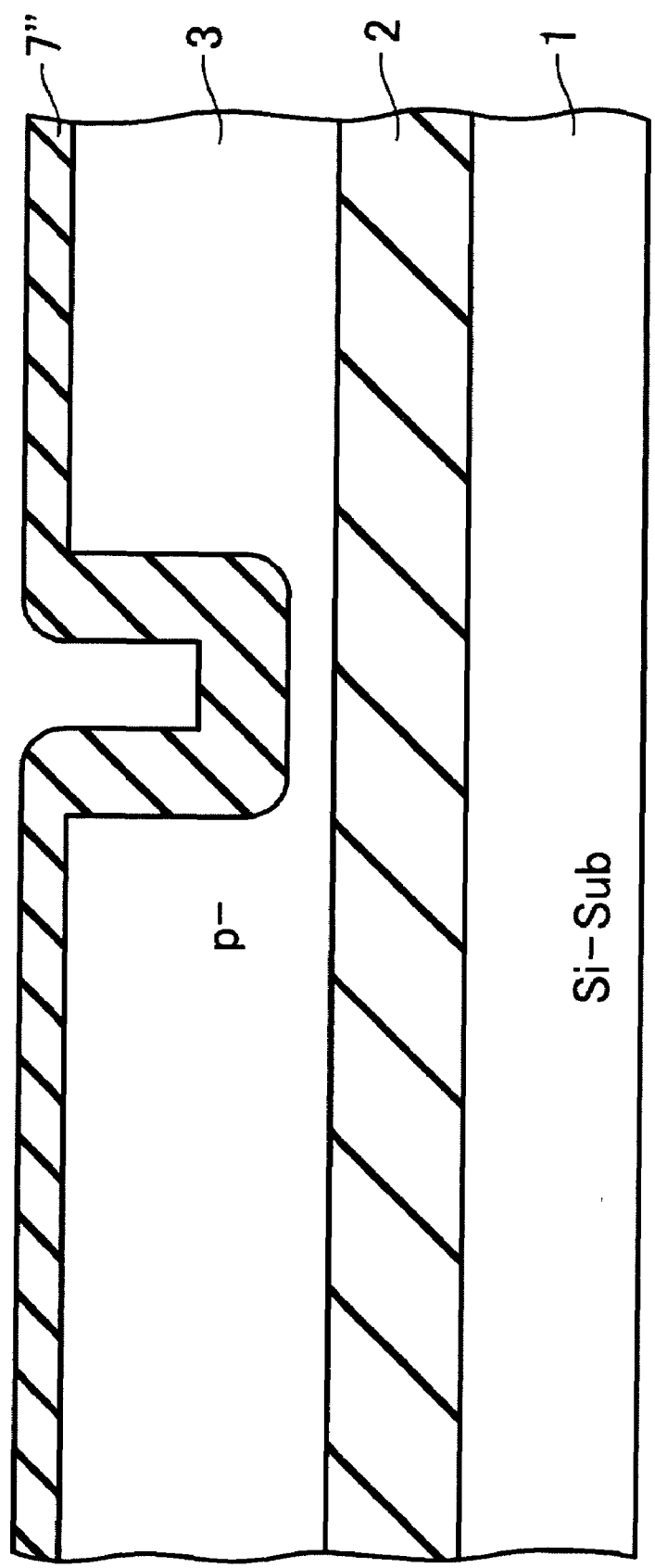

As shown in FIG. 18, a silicon oxide 7" is wholly provided on the active region 3. The silicon oxide 7" is also provided on the bottom and the side surface of the trench.

As shown in FIG. 19, the gate insulating layer 7 is created by selectively etching the silicon oxide 7". The gate electrode 8, which can be, for example made of polysilicon, is provided on the gate insulating layer 7 with a part of the gate insulating layer 7 being exposed. Semiconductor regions 4, 5, 6 and 11 can be provided by ion implantation into the active region 3 with using a mask on the gate insulating layer 7 and the gate electrode 8. So, the MOSFET 750 shown in FIG. 19 is obtained.

Eighth Embodiment

Figure 20:
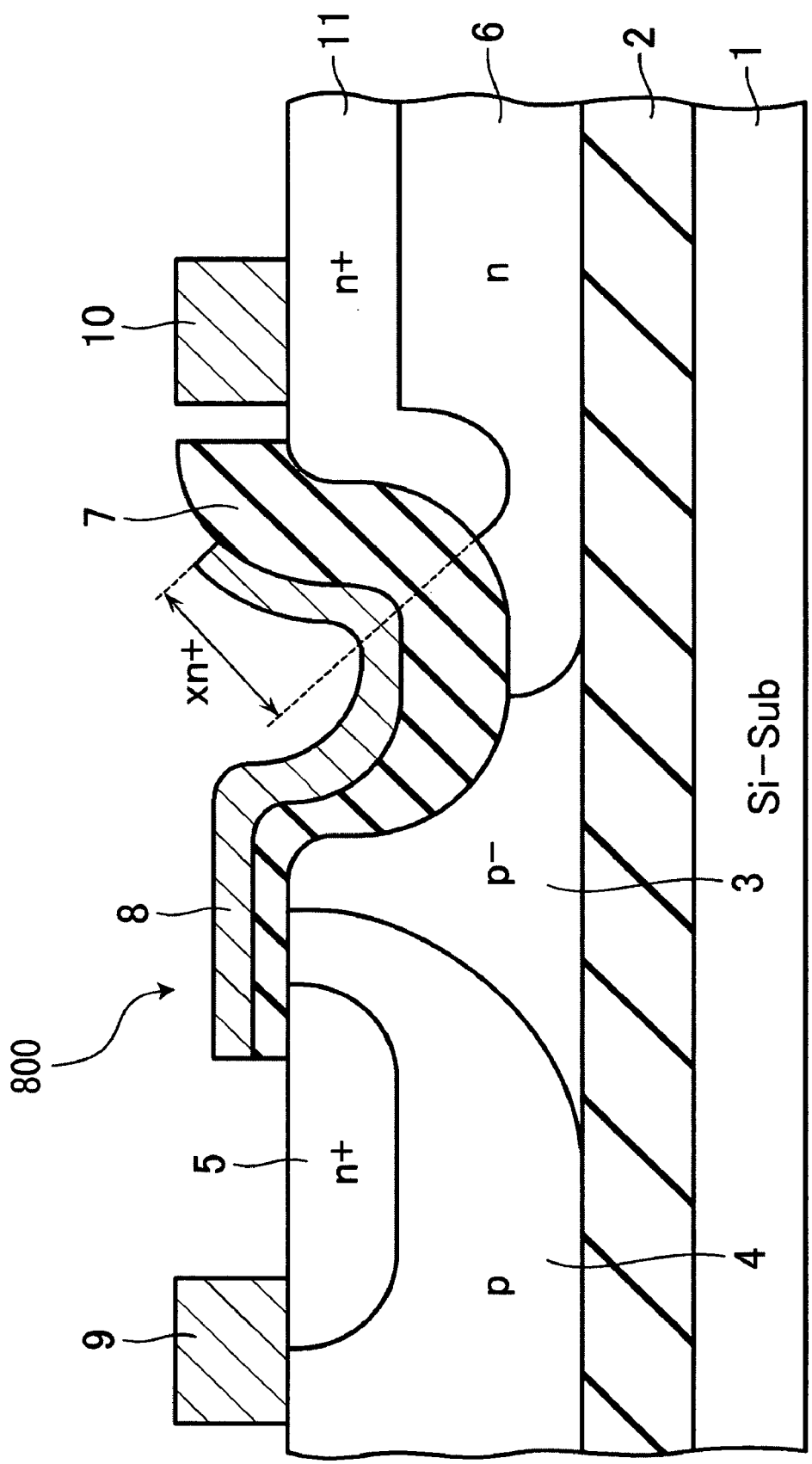
FIG. 20 is a cross sectional view of a MOSFET in accordance with an eighth embodiment of the present invention.

An eighth embodiment will be explained with reference to FIG. 20.

A MOSFET 800 in accordance with an eighth embodiment of the present invention, with respect to each portion of this embodiment, the same or corresponding portions of the MOSFET of the first, second, third, fourth, fifth, sixth, seventh or its modified embodiment shown in FIGS. 1-19 are designated by the same reference numerals, and its explanation of such portions is omitted.

In this embodiment, the gate electrode 8 is extended onto the contact region 11. The gate electrode 8 covers the contact region 11 with a length xn+. A carrier concentration in the drain region 6 is increased in comparison to the MOSFET 700 shown in FIG. 12, when the gate voltage is added and the MOSFET 800 is in an ON state. So, ON resistance may be reduced.

Ninth Embodiment

Figure 21:
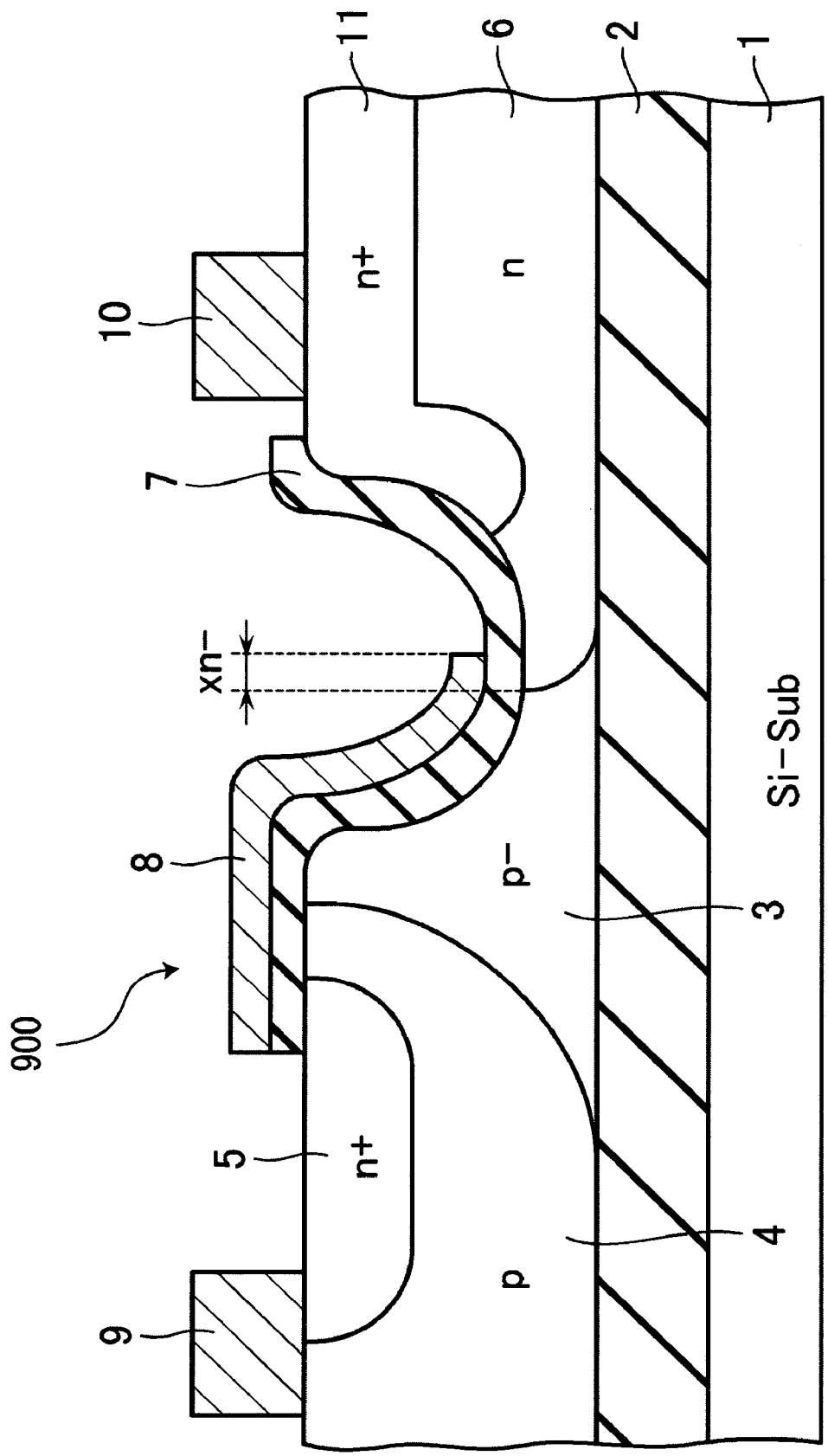
FIG. 21 is a cross sectional view of a MOSFET in accordance with a ninth embodiment of the present invention.

A ninth embodiment will be explained with reference to FIG. 21.

A MOSFET 900 in accordance with a ninth embodiment of the present invention, with respect to each portion of this embodiment, the same or corresponding portions of the MOSFET of the first, second, third, fourth, fifth, sixth, seventh, its modification or eighth embodiment shown in FIGS. 1-20 are designated by the same reference numerals, and its explanation of such portions is omitted.

In this embodiment, the gate insulating layer 7 has a substantially uniform thickness on the thick portion and the thin portion of the active region 3. The substantially uniform thickness gate insulating layer 7 may be formed by, for example low pressure CVD. Another structure is similar to the MOSFET 700 shown in FIG. 12.

Tenth Embodiment

Figure 22:
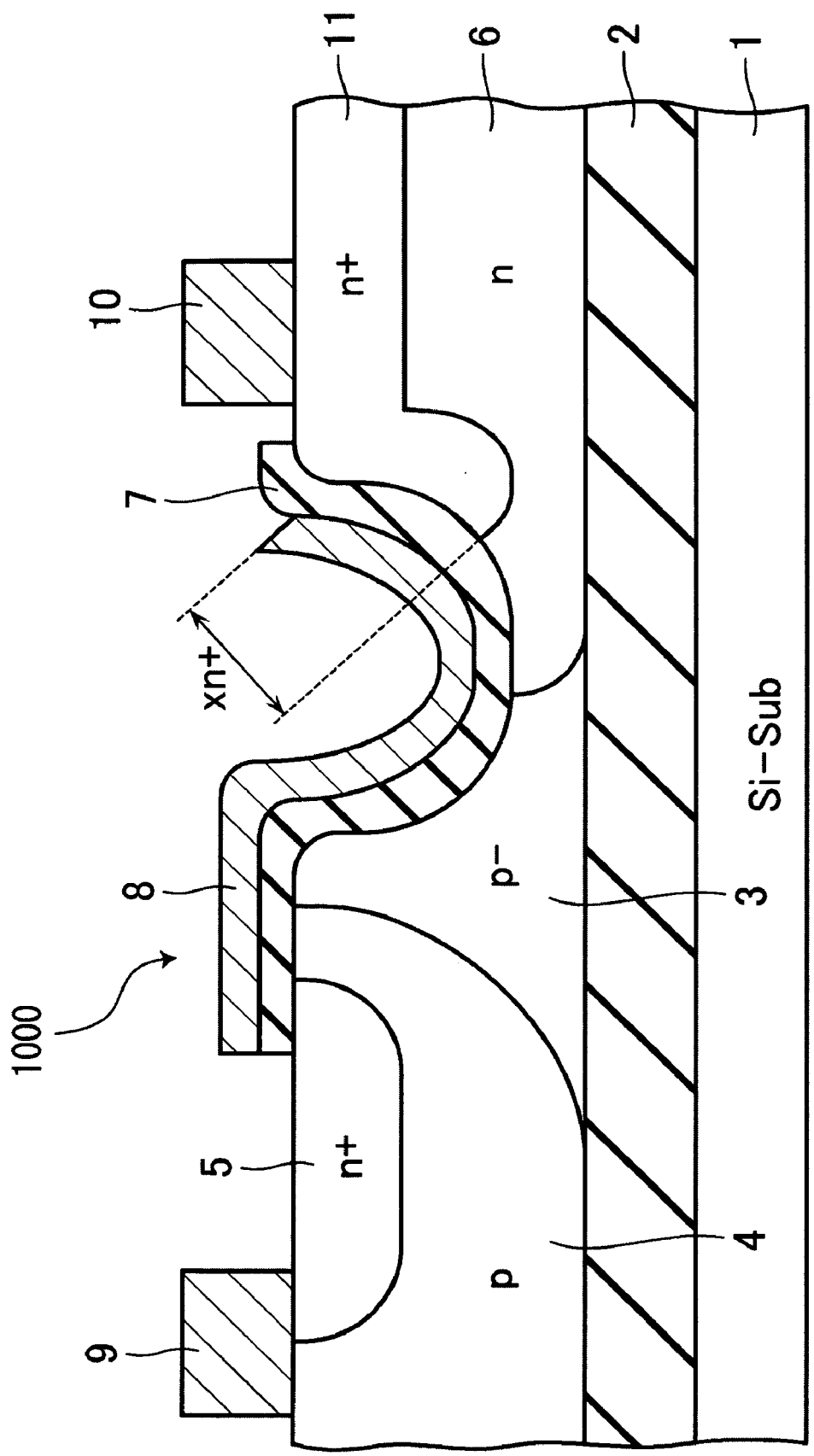
FIG. 22 is a cross sectional view of a MOSFET in accordance with a tenth embodiment of the present invention.

A tenth embodiment will be explained with reference to FIG. 22.

A MOSFET 1000 in accordance with a tenth embodiment of the present invention, with respect to each portion of this embodiment, the same or corresponding portions of the MOSFET of the first, second, third, fourth, fifth, sixth, seventh, its modification, eighth or ninth embodiment shown in FIGS. 1-21 are designated by the same reference numerals, and its explanation of such portions is omitted.

In this tenth embodiment, the gate electrode 8 is extended onto the contact region 11. The gate electrode 8 covers the contact region 11 with a length xn+. In contrast to the ninth embodiment, in the MOSFET 1000, the gate insulating layer 7 extends further towards the contact region 11 than the gate electrode 8. A part of the gate insulating layer 7 on the contact region 11 is not covered with the gate electrode 8. A carrier concentration in the drain region 6 is increased in comparison to the MOSFET 900 shown in FIG. 21, when the gate voltage is added and the MOSFET 1000 is ON state. So, ON resistance may be reduced.

Preferred thickness of the gate insulating layer will be explained hereinafter with reference to FIGS. 23 and 24.

Figure 23:
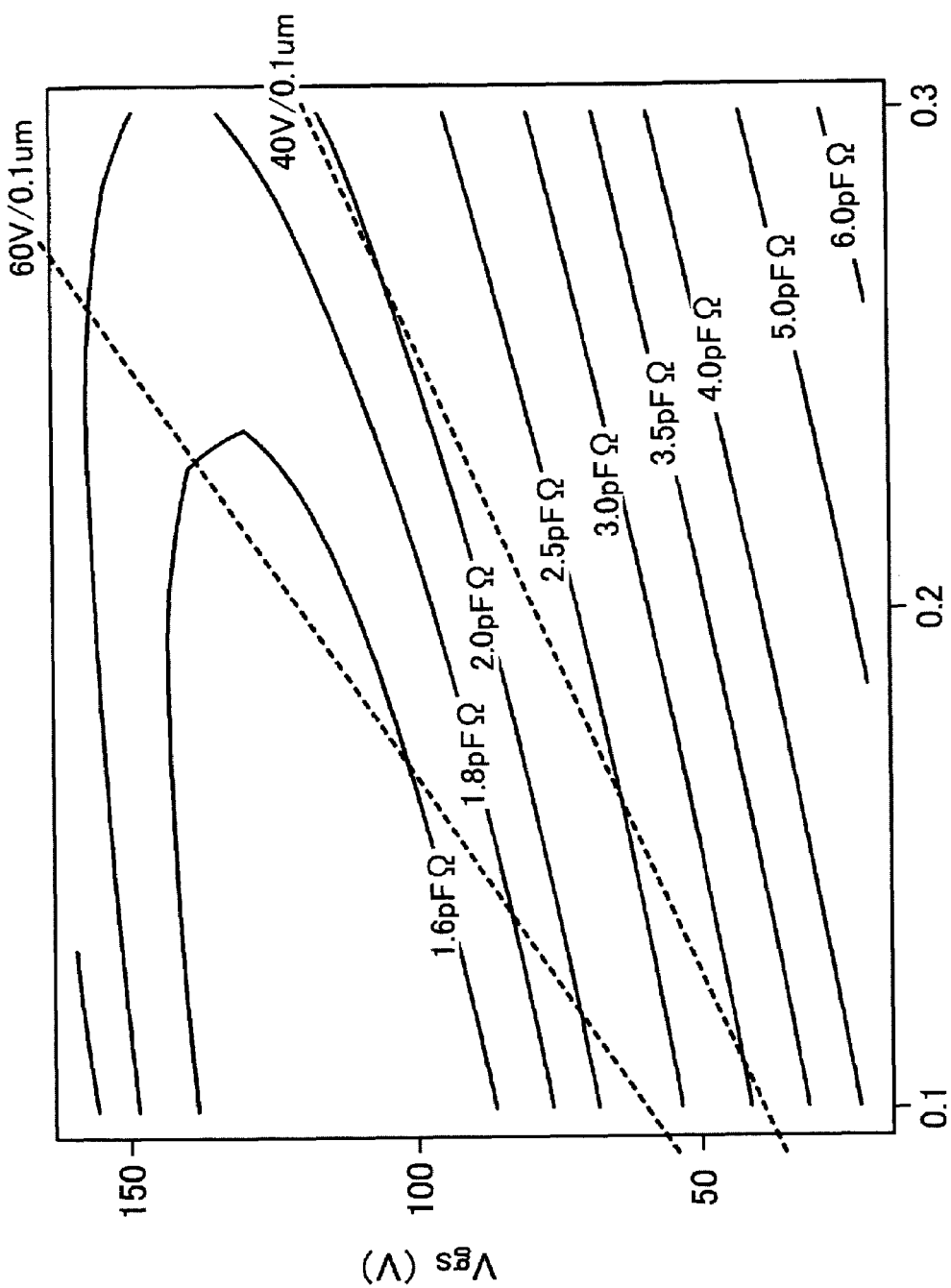
FIGS. 23 and 24 are graphs showing a C×R with a thickness of a gate insulating layer and gate voltage as a parameter, by a response surface methodology, where a voltage between the source and drain is 40 V.

FIG. 23 is graph showing C×R with taking a thickness of a gate insulating layer GateOx (μm) and gate voltage Vgs (V) as a parameter, by a response surface methodology, where a voltage between the source and drain is 40 V. FIG. 23 shows in a range of GateOx from 0.1-0.3 μm.

It is described in, for example "Percolation model: R. Degrave et al. IEEE ED Vol 45,904 (1998), T. Tanimoto et al. JJAP, Vo 136,1439 (1997)", that a quality of the gate insulating layer worsens or leak current increased, when a high electric field is applied to the gate insulating layer.

A maximum electric field for the insulating layer is considered 60 V/0.1 μm by a percolation model. A maximum electric field for the insulating layer in a trial manufacturing MOSFET (practical use) is 40 V/0.1 μm. In FIG. 23, a dashed line of 40 V/0.1 μm as a limit according to trial manufacturing and 60 V/0.1 μm as a limit according to percolation model are shown.

A minimum C×R with below the limit of trial manufacturing is obtained, where Vgs is 100 V and Gate Ox is 0.3 μm. In the conventional MOSFET, thinning the gate insulating layer and decreasing the threshold voltage are required in order to obtaining a MOSFET, which is driven in a low voltage and has a low ON resistance. However, as shown in FIG. 23, a low C×R is obtained if the gate voltage and the thickness of the gate insulating layer GateOx are increased in comparison to a conventional MOSFET.

Figure 24:
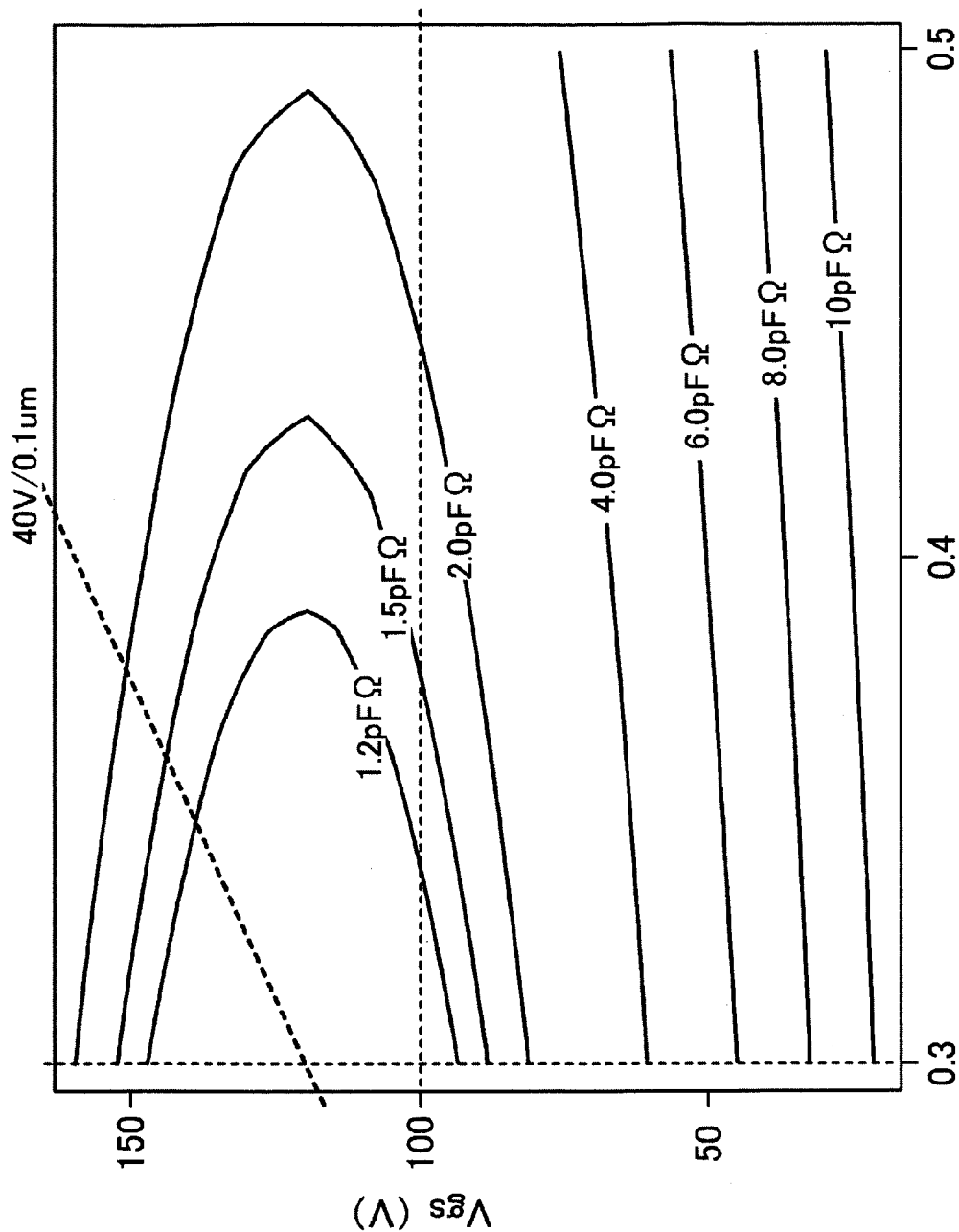

FIG. 24 is graph showing C×R where a thickness of a gate insulating layer Gate Ox (μm) and gate voltage Vgs (V) as a parameter, by a response surface methodology, where a voltage between the source and drain is 40 V. FIG. 24 shows in a range of GateOx from 0.3-0.5 μm, where the thickness of the gate insulating layer is thicker than the gate insulating layer in FIG. 23.

As shown in FIG. 24, C×R is decreased, when the gate voltage Vgs is increased. However, the decreased quantity of the C×R is small, when the GateOx is 0.5 μm or more.

It may be an optimal range for a MOSFET that the thickness of the gate insulating layer is 0.3-0.5 μm, the gate voltage Vgs is 100V or more, and preferably the MOSFET is operated 40V/0.1 μm or less.

Figure 25:
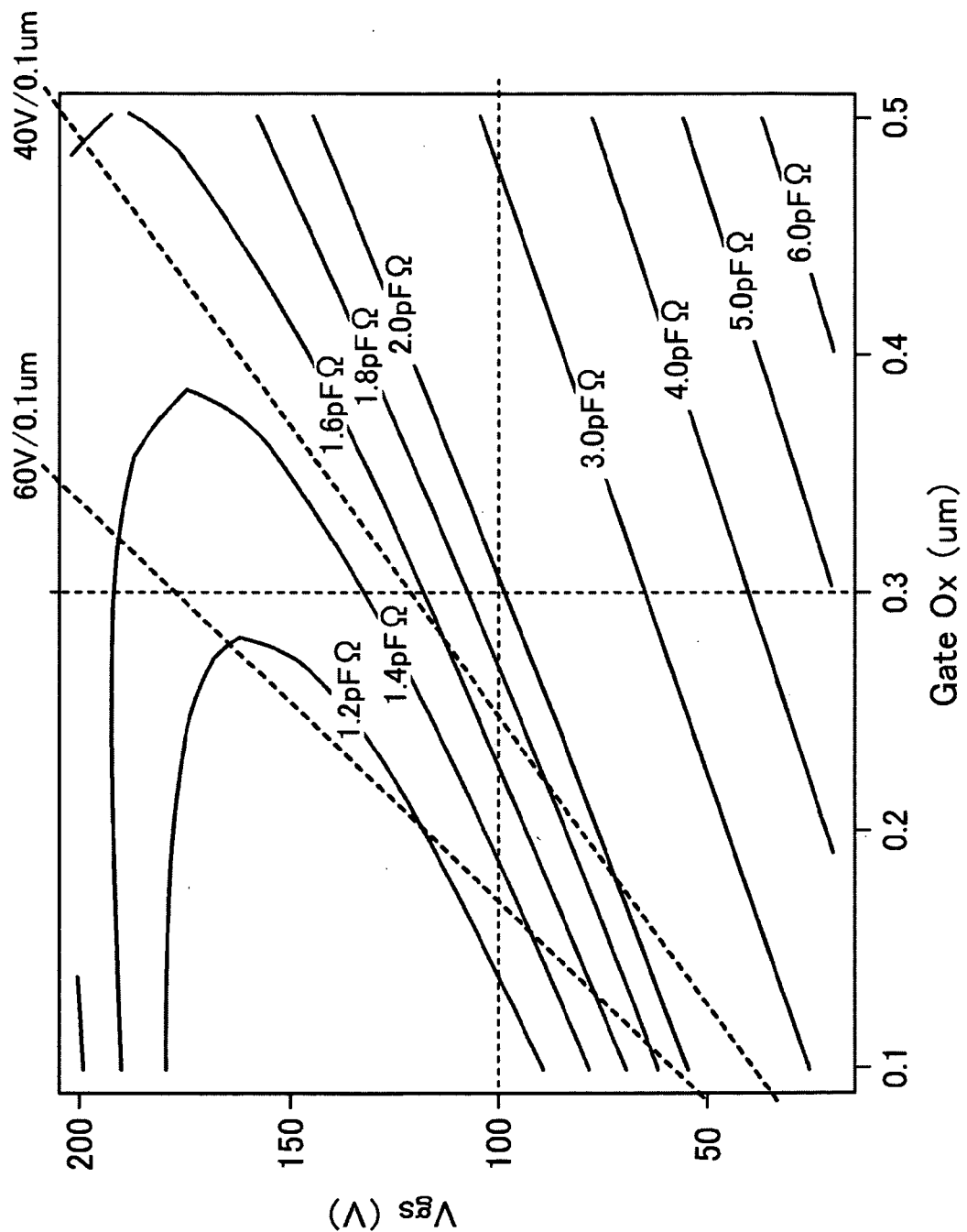
FIG. 25 is a graph showing a C×R with a thickness of a gate insulating layer and gate voltage as a parameter, by a response surface methodology, where a voltage between the source and drain is 20 V.

FIG. 25 is a graph showing a C×R with taking a thickness of a gate insulating layer and gate voltage as a parameter, by a response surface methodology, where a voltage between the source and drain is 20 V.

In this case, C×R is 2.0 pFΩ, when GateOx is 0.1 μm and Vgs is 40 V. However, where GateOx is 0.3 μm, C×R is 1.7 pFΩ with the limit for practical use, 40V/0.1 μm and C×R is improved about 15%.

It may be an optimal range for a MOSFET that the thickness of the gate insulating layer is 0.3-0.5 μm, the gate voltage Vgs is 100V or more, and preferably the MOSFET is operated 40V/0.1 μm or less.

Other embodiments of the present invention will be apparent to those skilled in the art from consideration of the specification and practice of the invention disclosed herein.

It is intended that the specification and example embodiments be considered as exemplary only, with a true scope and spirit of the invention being indicated by the following.

What is claimed is:

1. A MOSFET comprising:
    an active region of a first conductivity type provided on an insulating layer, the active region having a first portion and a second portion, the first portion being thicker than the second portion;
    a base region of the first conductivity type provided on the insulating layer, the base region having a higher impurity concentration than the first portion of the active region, the base region being in contact with the first portion of the active region and the insulating layer;
    a drain region of a second conductivity type provided on the insulating layer, the drain region being in contact with the second portion of the active region and the insulating layer, the drain region being spaced from the base region;
    a source region of the second conductivity type provided on a surface of the base region;
    a gate insulating layer provided on the source region, the base region, the active region and the drain region; and
    a gate electrode provided on the gate insulating layer.

2. A MOSFET of claim 1, wherein the gate insulating layer has a first part provided on the source region and a second part provided on the drain region, and the second part of the gate insulating layer is thicker than the first part of the gate insulating layer.

3. A MOSFET of claim 1, wherein the gate insulating layer extends to further in a direction from the source region to the drain region than the gate electrode.

4. A MOSFET of claim 1, further comprising, a contact region being in contact with the drain region and having a higher impurity concentration than the drain region.

5. A MOSFET of claim 4, wherein the gate insulating layer extends to a region on the contact region.

6. A MOSFET of claim 4, wherein the gate electrode extends to a region on the contact region.

7. A MOSFET of claim 5, wherein the gate electrode extends to a region on the contact region.

8. A MOSFET of claim 7, wherein the gate insulating layer extends to further in a direction from the source region to the drain region than the gate electrode.

9. A MOSFET of claim 1, wherein the gate insulating layer has a substantially uniform thickness.

10. A MOSFET of claim 1, wherein the gate insulating layer extends to a region on the drain region.

11. A MOSFET of claim 1, further comprising: a transitional portion provided in the active region between the first portion and the second portion, the transitional portion being thinner than the first portion and thicker than the second portion.

12. A MOSFET comprising:
    an active region of a first conductivity type provided on an insulating layer, the active region having a first portion, a second portion, the first portion being thicker than the second portion;
    a base region of the first conductivity type provided on the insulating layer, the base region having a higher impurity concentration than the first portion of the active region, the base region being in contact with the first portion of the active region and the insulating layer;

a drain region of a second conductivity type provided on the insulating layer, the drain region being in contact with the second portion of the active region and the insulating layer, the drain region being spaced from the base region;

a contact region being in contact with the drain region and having a higher impurity concentration than the drain region, a part of the contact region being thicker than the second portion of the active layer;

a source region of the second conductivity type provided on a surface of the base region;

a gate insulating layer provided on the source region, the base region, the active region and the drain region; and a gate electrode provided on the gate insulating layer.

13. A MOSFET of claim 12, wherein the gate insulating layer has a first part provided on the source region and a second part provided on the drain region, and the second part of the gate insulating layer is thicker than the first part of the gate insulating layer.

14. A MOSFET of claim 12, wherein the gate insulating layer extends to further in a direction from the source region to the drain region than the gate electrode.

15. A MOSFET of claim 12, wherein the gate insulating layer extends to a region on the contact region.

16. A MOSFET of claim 15, wherein the gate electrode extends to a region on the contact region.

17. A MOSFET of claim 16, wherein the gate insulating layer extends to further in a direction from the source region to the drain region than the gate electrode.

18. A MOSFET of claim 12, wherein the gate electrode extends to a region on the contact region.

19. A MOSFET of claim 12, wherein the gate insulating layer has a substantially uniform thickness.

20. A MOSFET of claim 12, wherein the gate insulating layer extends to a region on the drain region.

* * * * *

UNITED STATES PATENT AND TRADEMARK OFFICE
CERTIFICATE OF CORRECTION

| | | |
|---|---|---|
| PATENT NO. | : 7,537,983 B2 | Page 1 of 1 |
| APPLICATION NO. | : 11/344178 | |
| DATED | : May 26, 2009 | |
| INVENTOR(S) | : Takeshi Uchihara et al. | |

It is certified that error appears in the above-identified patent and that said Letters Patent is hereby corrected as shown below:

Title page Item (56) under U.S Patent Documents:
Please insert missing reference --6,943,406 Uchihara et al. 9-13-2005--.

Signed and Sealed this

Sixteenth Day of February, 2010

David J. Kappos
*Director of the United States Patent and Trademark Office*